(12) United States Patent
Morioka et al.

(10) Patent No.: US 8,349,472 B2
(45) Date of Patent: *Jan. 8, 2013

(54) ORGANIC ELECTROLUMINESCENCE DEVICE

(75) Inventors: Yukiko Morioka, Tokyo (JP); Atsushi Oda, Tokyo (JP); Hitoshi Ishikawa, Tokyo (JP); Satoru Toguchi, Tokyo (JP); Hiroshi Tada, Tokyo (JP)

(73) Assignee: Samsung Display Co., Ltd., Yongin (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/139,492

(22) Filed: May 31, 2005

(65) Prior Publication Data

US 2005/0221125 A1    Oct. 6, 2005

Related U.S. Application Data

(63) Continuation of application No. 09/736,519, filed on Dec. 13, 2000, now Pat. No. 6,899,961.

(30) Foreign Application Priority Data

Dec. 15, 1999    (JP) .................................. 1999/356682

(51) Int. Cl.
  *H01L 51/54* (2006.01)
(52) U.S. Cl. ......... 428/690; 428/917; 313/504; 313/506
(58) Field of Classification Search .................. 428/690, 428/917; 313/504, 506
See application file for complete search history.

(56) References Cited

U.S. PATENT DOCUMENTS

| | | | |
|---|---|---|---|
| 5,126,214 A | 6/1992 | Tokailin et al. | |
| 5,281,489 A * | 1/1994 | Mori et al. | 428/690 |
| 5,405,709 A | 4/1995 | Littman et al. | 428/690 |
| 5,536,949 A * | 7/1996 | Hosokawa et al. | 313/504 |
| 5,792,568 A | 8/1998 | Emoto et al. | 428/690 |
| 5,814,833 A | 9/1998 | Jenekhe | 257/40 |
| 6,010,796 A | 1/2000 | Kijima | 428/690 |
| 6,048,631 A | 4/2000 | Takahashi et al. | 428/690 |
| 6,214,481 B1 | 4/2001 | Sakai et al. | 428/690 |
| 6,235,414 B1 | 5/2001 | Epstein et al. | 428/690 |
| 6,310,360 B1 | 10/2001 | Forrest et al. | 257/40 |
| 6,312,836 B1 | 11/2001 | Bulovic et al. | 428/690 |
| 6,329,083 B1 | 12/2001 | Toguchi et al. | 428/690 |

(Continued)

FOREIGN PATENT DOCUMENTS

EP    866110    * 9/1998

(Continued)

OTHER PUBLICATIONS

Japanese Patent Office website translation of JP 11-176572, publication date Jul. 1999.*

(Continued)

*Primary Examiner* — Dawn L. Garrett
(74) *Attorney, Agent, or Firm* — H.C. Park & Associates, PLC

(57) ABSTRACT

An organic EL device including at least an anode, a cathode and an organic light-emitting zone with high brightness is provided. A mixture containing at least two compounds is used for a light-emitting zone and the spectrum of the luminescence from light-emitting zone includes at least one peak at a wavelength which is different from neither of fluorescent peak positions of the compounds included in light-emitting zone.

1 Claim, 2 Drawing Sheets

U.S. PATENT DOCUMENTS

| | | | |
|---|---|---|---|
| 6,465,116 B1 * | 10/2002 | Ishikawa et al. | 428/690 |
| 6,468,675 B1 * | 10/2002 | Ishikawa et al. | 428/690 |
| 6,555,253 B2 | 4/2003 | Hamada et al. | 428/690 |
| 6,582,837 B1 * | 6/2003 | Toguchi et al. | 428/690 |
| 6,660,408 B1 * | 12/2003 | Toguchi et al. | 428/690 |
| 6,670,051 B2 * | 12/2003 | Oda et al. | 428/690 |
| 6,682,831 B2 * | 1/2004 | Toguchi et al. | 428/690 |
| 6,699,594 B1 * | 3/2004 | Ishikawa et al. | 428/690 |
| 6,746,784 B2 * | 6/2004 | Toguchi et al. | 428/690 |
| 6,821,644 B2 * | 11/2004 | Ishikawa et al. | 428/690 |
| 6,833,200 B2 * | 12/2004 | Senoo et al. | 428/690 |
| 6,899,961 B2 * | 5/2005 | Morioka et al. | 428/690 |
| 2003/0054186 A1 | 3/2003 | Miyashita et al. | 428/500 |

FOREIGN PATENT DOCUMENTS

| | | | |
|---|---|---|---|
| EP | 0934992 | | 8/1999 |
| EP | 0 953 624 A1 * | | 11/1999 |
| JP | 3-200889 | | 9/1991 |
| JP | 7-65958 | | 3/1995 |
| JP | 7-138561 | | 5/1995 |
| JP | 8-20771 | | 1/1996 |
| JP | 8-40995 | | 2/1996 |
| JP | 8-40997 | | 2/1996 |
| JP | 8-53397 | | 2/1996 |
| JP | 8-87122 | | 4/1996 |
| JP | 8-239655 | | 9/1996 |
| JP | 9-268284 | | 10/1997 |
| JP | 09-268284 | * | 10/1997 |
| JP | 10-3990 | | 1/1998 |
| JP | 10-110163 | | 4/1998 |
| JP | 10-255984 | * | 9/1998 |
| JP | 11-74079 | | 3/1999 |
| JP | 11-140060 | | 5/1999 |
| JP | 11-144870 | | 5/1999 |
| JP | 11-144870 A | * | 5/1999 |
| JP | 11-176572 | * | 7/1999 |
| JP | 11-185961 A | * | 7/1999 |
| JP | 10-302960 A | * | 11/1999 |
| JP | 11-339963 | * | 12/1999 |
| JP | 11-345686 | | 12/1999 |
| WO | 9851757 | | 11/1998 |

OTHER PUBLICATIONS

Machine-generated translation for JP 09-268284 published Oct. 1997.*

Machine translation for JP 10-255984 A published Sep. 1998.*

Machine-generated translation of partial section of description for JP 11-339963, which was published Dec. 1999.*

Machine-generated tranlstion of claims section for JP 11-339963, which was published Dec. 1999.*

Machine generated translation for JP 11-185961 A, which was published Jul. 1999.*

Mirriam-Webster's Collegiate Dictionary, 1998, Tenth Edition, p. 746.

M.A. Baldo, et al., "High-Efficiency Fluorescent Organic Light-Emitting Devices Using a Phosphorescent Sensitizer", Nature, Macmillan Magazines Ltd., London, GB., vol. 403, No. 6771, Feb. 17, 2000, pp. 750-753.

K. Itano, et al., "Exciplex Formation at the Organic Solid-State Interface: Yellow Emission in Organic Light-Emitting Diodes Using Green-Fluorescent tris (8-quinolinolato) Aluminum and Hole-Transporting Molecular Materials with Low Ionization Potentials", Applied Physics Letters, American Institute of Physics, NY, US, vol. 72, No. 6, Feb. 9, 1998, pp. 636-638.

S. Tasch, et al., "Efficient Red- and Orange-Light-Emitting Diodes Realized by Excitation Energy Transfer from Blue-Light-Emitting Conjugated Polymers", Physical Review, B. Condensed Matter, The American Physical Society, NY, US, vol. 56, No. 8, Part 2, Aug. 15, 1997, pp. 4479-4483.

Yasuhiko Shirota, et al.; Multilayered Organic Electroluminescent Device Using a Novel Starburst Molecule, 4,4',4'-tris(3-methylphenylphenylamino)triphenylamine, as a Hole Transport Material.; Appl. Phys. Lett., vol. 65, No. 7; Aug. 15, 1994; pp. 807-809.

Yasuhiko Shirota, et al.; Starburst Molecules for Amorphous Molecular Materials.; The Chemical Society of Japan, 1989; pp. 1145-1148.

* cited by examiner

ORGANIC ELECTROLUMINESCENCE DEVICE

CROSS REFERENCE TO RELATED APPLICATIONS

This application is a continuation of prior U.S. patent application Ser. No. 09/736,519, filed on Dec. 13, 2000, now issued as U.S. Pat. No. 6,899,961, which claims the benefit of Japanese Application No. 356682/1999, filed on Dec. 15, 1999, both of which are hereby incorporated by reference for all purposes as if fully set forth herein.

BACKGROUND OF THE INVENTION (1) Field of the Invention

The present invention relates to an organic electroluminescence device having excellent luminescence properties.

(2) Description of the Prior Art

An organic electroluminescence device (hereinafter abbreviated to the organic EL device) is a light-emitting device which makes use of the principle that when an electric field is applied, a fluorescent material emits light in response to the charge recombination of holes injected from an anode and electrons injected from a cathode. After C. W. Tang et al. of Eastman Kodak Company reported a low-voltage-driven organic EL device using a double layered structure (C. W. Tang, S. A. Vanslyke, Applied-Physics Letters, 51, 913(1987) and the like), studies on an organic EL device have been briskly carried out. Tang et al. reported an organic EL device using tris(8-hydroxyquinolinol aluminum) in an electron-transporting and light-emitting layer and a triphenyldiamine derivative in a hole-transporting layer. This stacked structure gives such advantages as an improvement in the injection efficiency of holes into the light-emitting layer; blocking of electrons injected from a cathode, which increase the efficiency of exciton production from charge recombination; and confinement of the excitons into the light-emitting layer. A double layered structure composed of a hole-injecting and transporting layer and an electron-transporting and light-emitting layer or a triple layered structure composed of a hole-injecting and transporting layer, an electron-transporting and light-emitting layer and an electron-injecting and transporting layer is well known as an organic EL device. In order to increase the recombination efficiency of injected holes and electrons, various improvements in the device structure or fabrication process have been introduced to such multi-layered devices.

As a hole-transporting material, triphenylamine derivatives such as 4,4',4"-tris(3-methylphenylphenylamino)-triphenylamine and aromatic diamine derivatives such as N,N'-diphenyl-N,N'-bis(3-methylphenyl)-[1,1-biphenyl]-4,4'-diamine, which are starburst molecules, are well known (e.g., Japanese Patent Application Laid-Open Nos. 20771/1996, 40995/1996, 40997/1996, 543397/1996 and 87122/1996).

As an electron-transporting material, oxadiazole derivatives, triazole derivatives and the like are well known.

As an electron-transporting and light-emitting material, chelate complexes such as tris(8-quinolinolate)aluminum complex are known, and it is also well-known that devices using the mixture of a light-emitting material and a small amount of a fluorescent pigment have an improved efficiency. As these fluorescent pigments, there are known coumarin derivatives, tetraphenylbutadiene derivatives, bisstyrylarylene derivatives, oxadiazole derivatives, porphyrin derivatives, phenoxazoline type pigments, rhodamine type pigments, acridine type pigments and the like. It is reported that various color light in a visible region from blue to red are obtained from these materials, and realization of a full color organic EL device is expected (e.g., Japanese Patent Application Laid-Open Nos. 239655/1996, 138561/1995, 200289/1991 and the like).

Nowadays, the organic EL devices having a high luminance and a long life have been reported, but they are not always sufficient. Therefore, it has be strongly desired to develop the materials having a high performance.

SUMMARY OF THE INVENTION

The present invention has been developed in view of the above-mentioned point, and an object of the present invention is to provide an organic EL device having a high luminance.

The present invention is specified by aspects described in the following paragraphs (1) to (10).

(1) An organic electroluminescence device having at least an anode, a light-emitting zone and a cathode, wherein the light-emitting zone comprises a mixture containing at least two compounds, and the spectrum of the luminescence from light-emitting zone includes at least one peak at a wavelength which is different from neither of fluorescent peak positions of the compounds included in light-emitting zone;

(2) The organic electroluminescence device according to the above paragraph (1) wherein the spectrum of the luminescence from light-emitting zone includes at least one peak at a wavelength which is longer than neither of fluorescent peak positions of the compounds included in light-emitting zone;

(3) The organic electroluminescence device according to the above paragraph (1) or (2) wherein the light-emitting zone comprises a mixture containing at least two electroluminescent materials;

(4) The organic electroluminescence device according to the above paragraph (1) or (2) wherein the light-emitting zone comprises a mixture containing at least one electroluminescent material and one fluorescence material;

(5) The organic electroluminescence device according to any one of the above paragraphs (1) to (4) wherein light-emitting zone comprises a mixture containing at least one electroluminescent material represented by the following formula [1]

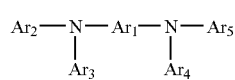

[1]

wherein Ar1 designates a substituted or non-substituted arylene group having 5 to 42 carbon atoms, Ar2 to Ar5 designate, independently with one another, a substituted or non-substituted aryl group having 6 to 20 carbon atoms;

(6) The organic electroluminescence device according to the above paragraph (5) wherein at least one of $Ar_2$ to $Ar_5$ of the compound represented by the formula [1] has a substituted or non-substituted styryl group as a substituent;

(7) The organic electroluminescence device according to any one of the above paragraphs-(1), (2) and (4) to (6) wherein the light-emitting zone comprises a mixture containing at least one of fluorescence materials such as a substituted or non-substituted aromatic hydrocarbon, a substituted or non-substituted fused polycyclic hydrocarbon, a substituted or non-substituted heterocyclic compound, and a substituted or non-substituted fused heterocyclic compound;

(8) The organic electroluminescence device according to any one of the above paragraphs (1) to (7) wherein the light-emitting zone is adjacent to the anode;

(9) The organic electroluminescence device according to any one of the above paragraphs (1) to (7) wherein a hole-injecting zone is present between the anode and the light-emitting zone; and

(10) The organic electroluminescence device according to the above paragraph (8) or (9) wherein an electron-injecting zone is present between the cathode and the light-emitting zone.

In an organic electroluminescence device regarding the present invention, a mixture containing at least two compounds is used for a light-emitting zone, whereby the spectrum of the luminescence includes at least one peak at a wavelength which is different from neither of fluorescent peak positions of the compounds included in light-emitting zone and the luminescence is obtained with high brightness.

BRIEF DESCRIPTION OF THE DRAWINGS

In FIGS. 1 to 4, numeral 1 is a substrate, 2 is an anode, 3 is a hole-injecting zone, 4 is a light-emitting zone, 5 is an electron-injecting zone, and 6 is a cathode.

DETAILED DESCRIPTION OF PREFERRED EMBODIMENTS

Figure 1:
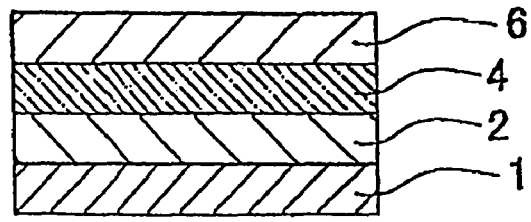
FIG. 1 is a cross-sectional view showing one example of an organic EL device regarding the present invention.

Next, the present invention will be described in detail.

The present invention is directed to an organic EL device in which a mixture containing at least two compounds is used for a light-emitting zone, and it is characterized in that the organic EL device has at least one peak which is different from neither of that of the spectrum of the compounds included in light-emitting zone.

In a compound of the above-mentioned formula [1] which is used as a electroluminescent material contained in a mixture for forming a light-emitting zone in the present invention, $Ar_1$ designates a substituted or non-substituted arylene group having 5 to 42 carbon atoms. Examples of this arylene group include a naphthylene group, an anthrylene group, a perylenylene group, a 1:2 benzoperylenylene group, a 1:2:7:8 dibenzoperylenylene group, a 1:2:11:12 dibenzoperylenylene group, a terphenylene group, a pentasenylene group, a bisanthrenylene group, a 10,10'-(9,9'-bisanthryl)ylene group, a 4,4'-(1,1'-binaphthyl)ylene, 4,10'-(1,9'-naphthylanthryl)ylene group, a divalent group represented by the formula [2]

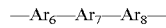  [2]

wherein $Ar_6$ to $Ar_8$ are each a naphthylene group or an anthrylene group, divalent groups formed by two hydrogen atoms removal from aromatic hydrocarbons or fused polycyclic hydrocarbons such as phenanthrene, pyrene and terphenyl, or heterocyclic compounds or a fused heterocyclic compounds such as carbazole, pyrrole, thiophene, furan, imidazole, pyrazole, isothiazole, isoxazole, pyridine, pyrazine, pyrimidine, pyridazine, furazane, thianthrene, isobenzofuran, phenoxazine, indolizine, indole, isoindole, 1 H-indazole, purine, quinoline, isoquinoline, phthalazine, naphthyridine, quinoxaline, quinazoline, cinnoline, pteridine, carbazole, .beta.-carbazoline, phenanthridine, acridine, perimidine, phenanthroline, phenazine, phenothiazine and phenoxazine, and derivatives thereof.

In the compound of the above-mentioned formula [1], $Ar_{2\ to\ Ar5}$ are each independently a substituted or non-substituted aryl group having 6 to 20 carbon atoms. Examples of the aryl group having 6 to 20 carbon atoms include a phenyl group, a naphthyl group, an anthryl group, a phenanthryl group, a naphthacenyl group, a pyrenyl group, and derivatives thereof.

As the fluorescence material contained in the mixture for forming the light-emitting zone in the present invention, there is used a substituted or non-substituted aromatic hydrocarbon, a substituted or non-substituted fused polycyclic hydrocarbon, a substituted or non-substituted heterocyclic compound, a substituted or non-substituted fused heterocyclic compound, or the like.

Examples of the aromatic hydrocarbon and the fused polycyclic hydrocarbon mentioned above include benzene, naphthalene, anthracene, phenanthrene, naphthacene, pentacene, pyrene, chrysene, picene, perylene, terphenyl, and derivatives thereof.

Examples of the heterocyclic compound and the fused heterocyclic compound mentioned above include pyrrole, thiophene, furan, pyran, 4H-pyran, xanthene, imidazole, pyrazole, 3a,6a-diazapentalene, isothiazole, isoxazole, oxazole, oxadiazole, triazole, coumarin, isocoumarin, pyridine, pyrazine, pyrimidine, pyridazine, furazane, thianthrene, isobenzofuran, indolizine, indole, isoindole, 1H-indazole, purine, quinoline, isoquinoline, quinolone, acridone, phthalazine, naphthyridine, quinoxaline, quinazoline, cinnoline, pteridine, carbazole, β-carbazoline, phenanthridine, acridine, perimidine, phenanthroline, phenazine, phenothiazine, phenoxazine, phenoxazone, and derivatives thereof.

Examples of a substituent which each of $Ar_1$ to $Ar_8$, the aromatic hydrocarbon, the fused polycyclic hydrocarbon, the heterocyclic compound or the fused heterocyclic compound include a halogen atom, a hydroxyl group, a substituted or non-substituted amino group, a nitro group, a cyano group, a substituted or non-substituted alkyl group, a substituted or non-substituted alkenyl group, a substituted or non-substituted cycloalkyl group, a substituted or non-substituted alkoxy group, a substituted or non-substituted aromatic hydrocarbon, a substituted or non-substituted aromatic heterocyclic group, a substituted or non-substituted aralkyl group, a substituted or non-substituted aryloxy group, a substituted or non-substituted alkoxycarbonyl group, and a carboxyl group.

Two of the substituents of $Ar_1$ to $Ar_5$, the aromatic hydrocarbon, the fused polycyclic hydrocarbon, the heterocyclic compound and the fused heterocyclic compound may form a ring, and two of the substituents which each aryl group of $Ar_6$ to $Ar_8$ has may form a ring.

Examples of the halogen atom mentioned above include fluorine, chlorine, bromine and iodine.

The substituted or non-substituted amino group mentioned above can be represented by $—NX^1X^2$, and examples of $X^1$ and $X^2$ include, each independently, a hydrogen atom, methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisbbutyl group, 1,2-diiodoethyl group, 1,3-diiodopropyl group, 2,3-diiodo-t-butyl group, 1,2,3-triiodopropyl group, aminomethyl group, 1-aminoethyl group, 2-aminoethyl group, 2-aminoisobutyl group, 1,2 -diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, 1,2,3-trinitropropyl group, phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 4-styrylphenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, 4"-t-butyl-p-terphenyl-4-yl group, 2-pyrrolyl group, 3-pyrrolyl group, pyrazinyl group, 2-pyridinyl group, 3-pyridinyl group, 4-pyridinyl group, 2-indolyl group, 3-indolyl group, 4-indolyl group, 5-indolyl group, 6-indolyl group, 7-indolyl group, 1-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthrolin-2-yl group, 1,7-phenanthrolin-3-yl group, 1,7-phenanthrolin-4-yl group, 1,7-phenanthrolin-5-yl group, 1,7-phenanthrolin-6-yl group, 1,7-phenanthrolin-8-yl group, 1,7-phenanthrolin-9-yl group, 1,7 -phenanthrolin-10-yl group, 1,8-phenanthrolin-2-yl group, 1,8-phenanthrolin-3-yl group, 1,8-phenanthrolin-4-yl group, 1,8-phenanthrolin-5-yl group, 1,8-phenanthrolin-6-yl group, 1,8-phenanthrolin-7-yl group, 1,8-phenanthrolin-9-yl group, 1,8-phenanthrolin-10-yl group, 1,9-phenanthrolin-2-yl group, 1,9-phenanthrolin-3-yl group, 1,9-phenanthrolin-4-yl group, 1,9-phenanthrolin-5-yl group, 1,9-phenanthrolin-6-yl group, 1,9-phenanthrolin-7-yl group, 1,9-phenanthrolin-8-yl group, 1,9-phenanthrolin-10-yl group, 1,10-phenanthrolin-2-yl group, 1,10-phenanthrolin-3-yl group, 1,10-phenanthrolin-4-yl group, 1,10-phenanthrolin-5-yl group, 2,9-phenanthrolin-1-yl group, 2,9-phenanthrolin-3-yl group, 2,9-phenanthrolin-4-yl group, 2,9-phenanthrolin-5-yl group, 2,9-phenanthrolin-6-yl group, 2,9-phenanthrolin-7-yl group, 2,9-phenanthrolin-8-yl group, 2,9-phenanthrolin-10-yl group, 2,8-phenanthrolin-1-yl group, 2,8-phenanthrolin-3-yl group, 2,8-phenanthrolin-4-yl group, 2,8-phenanthrolin-5-yl group, 2,8-phenanthrolin-6-yl group, 2,8-phenanthrolin-7-yl group, 2,8-phenanthrolin-9-yl group, 2,8-phenanthrolin-10-yl group, 2,7-phenanthrolin-1-yl group, 2,7-phenanthrolin-3-yl group, 2,7-phenanthrolin-4-yl group, 2,7-phenanthrolin-5-yl group, 2,7-phenanthrolin-6-yl group, 2,7-phenanthrolin-8-yl group, 2,7-phenanthrolin-9-yl group, 2,7-phenanthrolin-10-yl group, 1-phenazinyl group, 2-phenazinyl group, 1-phenothiazinyl group, 2-phenothiazinyl group, 3-phenothiazinyl group, 4-phenothiazinyl group, 1-phenoxazinyl group, 2-phenoxazinyl group, 3-phenoxazinyl group, 4-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrhol-1-yl group, 2-methylpyrrhol-3-yl group, 2-methylpyrrhol-4-yl group, 2-methylpyrrhol-5-yl group, 3-methylpyrrhol-1-yl group, 3-methylpyrrhol-2-yl group, 3-methylpyrrhol-4-yl group, 3-methylpyrrhol-5-yl group, 2-t-butylpyrrhol-4-yl group, 3-(2-phenylpropyl)pyrrhol-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group and 4-t-butyl-3-indolyl group.

Examples of the substituted or non-substituted alkyl group mentioned above include a methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1 -bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group and 1,2,3-trinitropropyl group.

Examples of the substituted or non-substituted alkenyl group mentioned above include a vinyl group, allyl group, 1-butenyl group, 2-butenyl group, 3-butenyl group, 1,3-butanedienyl group, 1-methylvinyl group, styryl group, 4-diphenylaminostyryl group, 4-di-p-tolylaminostyryl group, 4-di-m-tolylaminostyryl group, 2,2-diphenylvinyl group, 1,2-diphenylvinyl group, 1-methylallyl group, 1,1-dimethylallyl group, 2-methylallyl group, 1-phenylallyl group, 2-phenylallyl group, 3-phenylallyl group, 3,3-diphenylallyl group, 1,2-dimethylallyl group, 1-phenyl-1-butenyl group and 3-phenyl-1-butenyl group.

Examples of the substituted or non-substituted cycloalkyl group mentioned above include a cyclopropyl group, cyclobutyl group, cyclopentyl group, cyclohexyl group and 4-methylcyclohexyl grouop.

The substituted or non-substituted alkoxy group is a group represented by —OY, and examples of Y include a methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl-group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2',3-tribromopropyl group, iodomethyl group, 1-iodoethyl group, 2-iodoethyl group, 2-iodoisobutyl group, 1,2-diiodoethyl group, 1,3-diiodopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group and 1,2,3-trinitropropyl group.

Examples of the substituted or non-substituted aromatic hydrocarbon mentioned above include a phenyl group, 1-naphthyl group, 2-naphthyl group, 9-fluorenyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group and 4"-t-butyl-p-terphenyl-4-yl group.

Examples of the substituted or non-substituted aromatic heterocyclic group mentioned above include a 1-pyrrolyl group, 2-pyrrolyl group, 3-pyrrolyl group, pyrazinyl group, 2-pyridinyl group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 9-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthrolin-2-yl group, 1,7-phenanthrolin-3-yl group, 1,7-phenanthrolin-4-yl group, 1,7-phenanthrolin-5-yl group, 1,7-phenanthrolin-6-yl group, 1,7-phenanthrolin-8-yl group, 1,7-phenanthrolin-9-yl group, 1,7-phenanthrolin-10-yl group, 1,8-phenanthrolin-2-yl group, 1,8-phenanthrolin-3-yl group, 1,8-phenanthrolin-4-yl group, 1,8-phenanthrolin-5-yl group, 1,8-phenanthrolin-6-yl group, 1,8-phenanthrolin-7-yl group, 1,8-phenanthrolin-9-yl group, 1,8-phenanthrolin-10-yl group, 1,9-phenanthrolin-2-yl group, 1,9-phenanthrolin-3-yl group, 1,9-phenanthrolin-4-yl group, 1,9-phenanthrolin-5-yl group, 1,9-phenanthrolin-6-yl group, 1,9-phenanthrolin-7-yl group, 1,9-phenanthrolin-8-yl group, 1,9-phenanthrolin-10-yl group, 1,10-phenanthrolin-2-yl group, 1,10-phenanthrolin-3-yl group, 1,10-phenanthrolin-4-yl group, 1,10-phenanthrolin-5-yl group, 2,9-phenanthrolin-1-yl group, 2,9-phenanthrolin-3-yl group, 2,9-phenanthrolin-4-yl group, 2,9-phenanthrolin-5-yl group, 2,9-phenanthrolin-6-yl group, 2,9-phenanthrolin-7-yl group, 2,9-phenanthrolin-8-yl group, 2,9-phenanthrolin-10-yl group, 2,8-phenanthrolin-1-yl group, 2,8-phenanthrolin-3-yl group, 2,8-phenanthrolin-4-yl group, 2,8-phenanthrolin-5-yl group, 2,8-phenanthrolin-6-yl group, 2,8-phenanthrolin-7-yl group, 2,8-phenanthrolin-9-yl group, 2,8-phenanthrolin-10-yl group, 2,7-phenanthrolin-1-yl group, 2,7-phenanthrolin-3-yl group, 2,7-phenanthrolin-4-yl group, 2,7-phenanthrolin-5-yl group, 2,7-phenanthrolin-6-yl group, 2,7-phenanthrolin-8-yl group, 2,7-phenanthrolin-9-yl group, 2,7-phenanthrolin-10-yl group, 1-phenazinyl group, 2-phenazinyl group, 1-phenothiazinyl group, 2-phenothiazinyl group, 3-phenothiazinyl group, 4-phenothiazinyl group, 10-phenothiazinyl group, 1-phenoxazinyl group, 2-phenoxazinyl group, 3-phenoxazinyl group, 4-phenoxazinyl group, 10-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrhol-1-yl group, 2-methylpyrrhol-3-yl group, 2-methylpyrrhol-4-yl group, 2-methylpyrrhol-5-yl group, 3-methylpyrrhol-1-yl group, 3-methylpyrrhol-2-yl group, 3-methylpyrrhol-4-yl group, 3-methylpyrrhol-5-yl group, 2-t-butylpyrrhol-4-yl group, 3-(2-phenylpropyl)pyrrhol-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group and 4-t-butyl-3-indolyl group.

Examples of the substituted or non-substituted aralkyl group mentioned above include a benzyl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, 2-β-naphthylisopropyl group, 1-pyrrolylmethyl group, 2-(1-pyrrolyl)ethyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, α-cyanobenzyl group, 1-hydroxy-2-phenylisopropyl group and 1-chloro-2-phenylisopropyl group.

The substituted or non-substituted aryloxy group mentioned above can be represented by —OZ, and examples of Z include a phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, 4"-t-butyl-p-terphenyl-4-yl group, 2-pyrrolyl group, 3-pyrrolyl group, pyrazinyl group, 2-pyridinyl group, 3-pyridinyl group, 4-pyridinyl group, 2-indolyl group, 3-indolyl group, 4-indolyl group, 5-indolyl group, 6-indolyl group, 7-indolyl group, 1-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthrolin-2-yl group, 1,7-phenanthrolin-3-yl group, 1,7-phenanthrolin-4-yl group, 1,7-phenanthrolin-5-yl group, 1,7-phenanthrolin-6-yl group, 1,7-phenanthrolin-8-yl group, 1,7-phenanthrolin-9-yl group, 1,7-phenanthrolin-10-yl group, 1,8-phenanthrolin-2-yl group, 1,8-phenanthrolin-3-yl group, 1,8-phenanthrolin-4-yl group, 1,8-phenanthrolin-5-yl group, 1,8-phenanthrolin-6-yl group, 1,8-phenanthrolin-7-yl group, 1,8-phenanthrolin-9-yl group, 1,8-phenanthrolin-10-yl group, 1,9-phenanthrolin-2-yl group, 1,9-phenanthrolin-3-yl group, 1,9-phenanthrolin-4-yl group, 1,9-phenanthrolin-5-yl group, 1,9-phenanthrolin-6-yl group, 1,9-phenanthrolin-7-yl group, 1,9-phenanthrolin-8-yl group, 1,9-phenanthrolin-10-yl group, 1,10-phenanthrolin-2-yl group, 1,10-phenanthrolin-3-yl group, 1,10-phenanthrolin-4-yl group, 1,10-phenanthrolin-5-yl group, 2,9-phenanthrolin-1-yl group, 2,9-phenanthrolin-3-yl group, 2,9-phenanthrolin-4-yl group, 2,9-phenanthrolin-5-yl group, 2,9-phenanthrolin-6-yl group, 2,9-phenanthrolin-7-yl group, 2,9-phenanthrolin-8-yl group, 2,9-phenanthrolin-10-yl group, 2,8-phenanthrolin-1-yl group, 2,8-phenanthrolin-3-yl group, 2,8-phenanthrolin-4-yl group, 2,8-phenanthrolin-5-yl group, 2,8-phenanthrolin-6-yl group, 2,8-phenanthrolin-7-yl group, 2,8-phenanthrolin-9-yl group, 2,8-phenanthrolin-10-yl group, 2,7-phenanthrolin-1-yl group, 2,7-phenanthrolin-3-yl group, 2,7-phenanthrolin-4-yl group, 2,7-phenanthrolin-5-yl group, 2,7-phenanthrolin-6-yl group, 2,7-phenanthrolin-8-yl group, 2,7-phenanthrolin-9-yl group, 2,7-phenanthrolin-10-yl group, 1-phenazinyl group, 2-phenazinyl group, 1-phenothiazinyl group, 2-phenothiazinyl group, 3-phenothiazinyl group, 4-phenothiazinyl group, 1-phenoxazinyl group, 2-phenoxazinyl group, 3-phenoxazinyl group, 4-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrhol-1-yl group, 2-methylpyrrhol-3-yl group, 2-methylpyrrhol-4-yl group, 2-methylpyrrhol-5-yl group, 3-methylpyrrhol-1-yl group, 3-methylpyrrhol-2-yl group, 3-methylpyrrhol-4-yl group, 3-methylpyrrhol-5-yl group, 2-t-butylpyrrhol-4-yl group, 3-(2-phenylpropyl)pyrrhol-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group and 4-t-butyl-3-indolyl group.

The substituted or non-substituted alkoxycarbonyl group mentioned above can be represented by —COOY, and examples of Y include a methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 112,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group and 1,2,3-trinitropropyl group.

Furthermore, examples of the substituted or non-substituted styryl group which at least one of $Ar_2$ to $Ar_5$ has as a substituent include non-substituted styryl group and a 2,2-diphenylvinyl group. In addition, the substituted styryl group can be employed having, as a substituent on the terminal phenyl group, a halogen atom, a hydroxyl group, the substituted and non-substituted amino groups, a nitro group, a cyano group, the above substituted and non-substituted alkyl groups, the above substituted and non-substituted alkenyl groups, the above substituted and non-substituted cycloalkyl groups, the above substituted and non-substituted alkoxy groups, the above substituted and non-substituted aromatic hydrocarbons, the above substituted and non-substituted aromatic heterocyclic groups, the above substituted and non-substituted aralkyl groups, the above substituted and non-substituted aryloxy groups, the above substituted and non-substituted alkoxycarbonyl groups and carboxyl group as well as substituted 2,2'-diphenylvinyl can be employed.

In addition, examples of the divalent group which can form a ring include a tetramethylene group, a pentamethylene group, a hexamethylene group, a diphenylmethane-2,2'-diyl group, a diphenylethane-3,3'-diyl group and a diphenylpropane-4,4'-diyl.

Following are examples of the compounds represented by the above formula [1]. But the present invention is not limited to these examples unless the spirit or scope of the invention is changed.

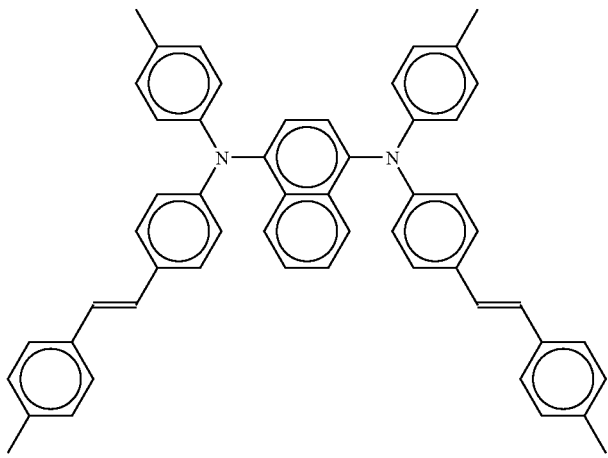

[3]

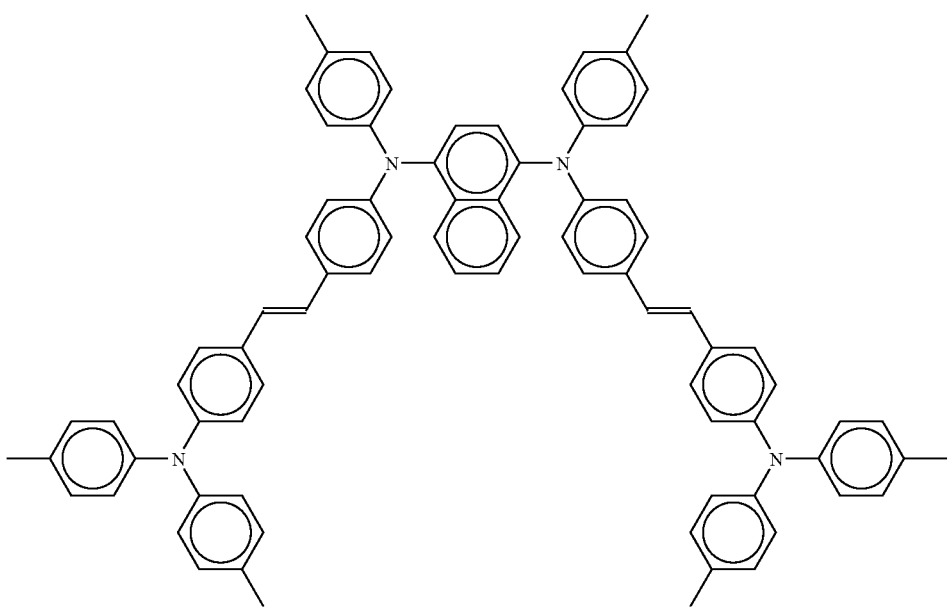

[4]

-continued
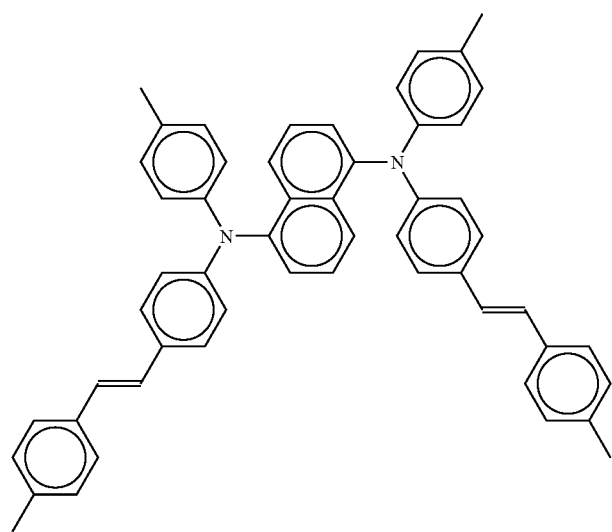
[5]
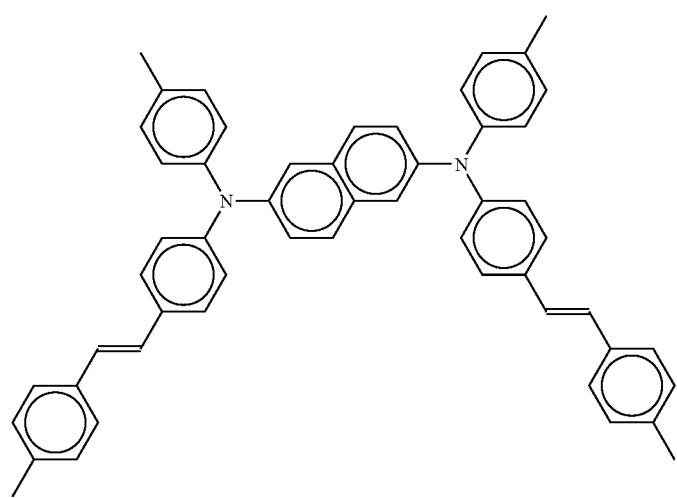
[6]
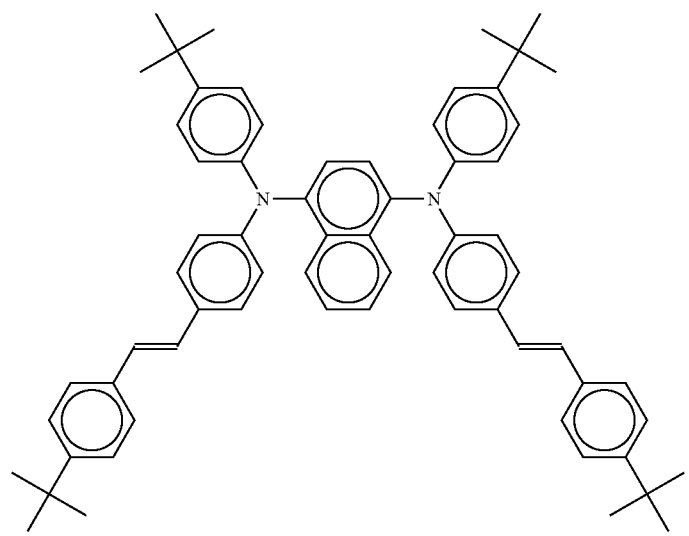
[7]

-continued
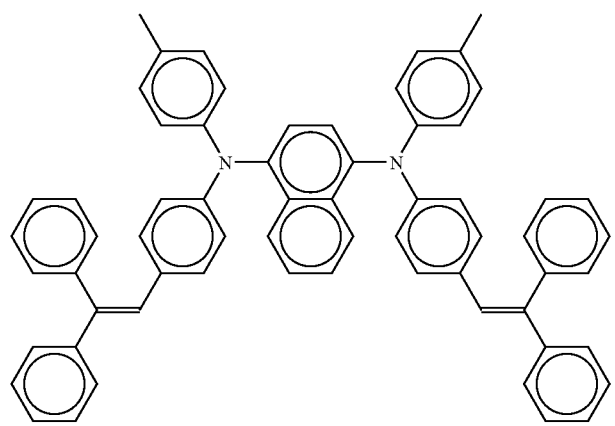
[8]
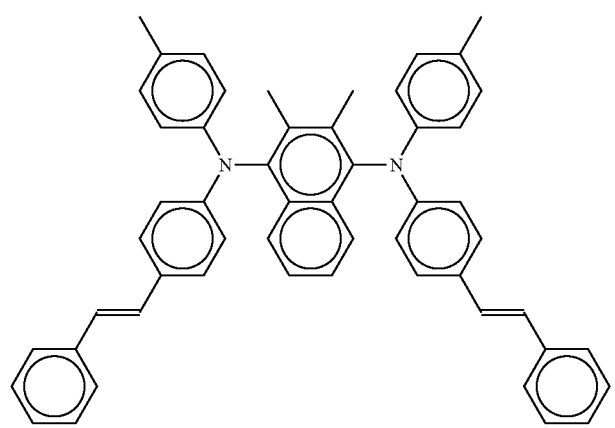
[9]
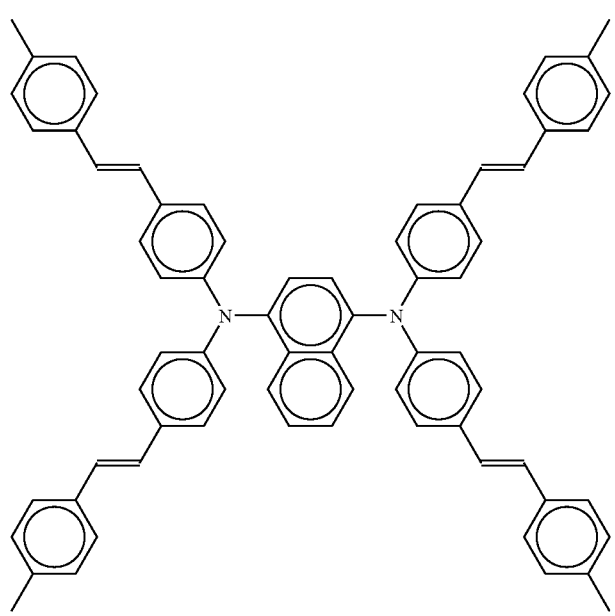
[10]

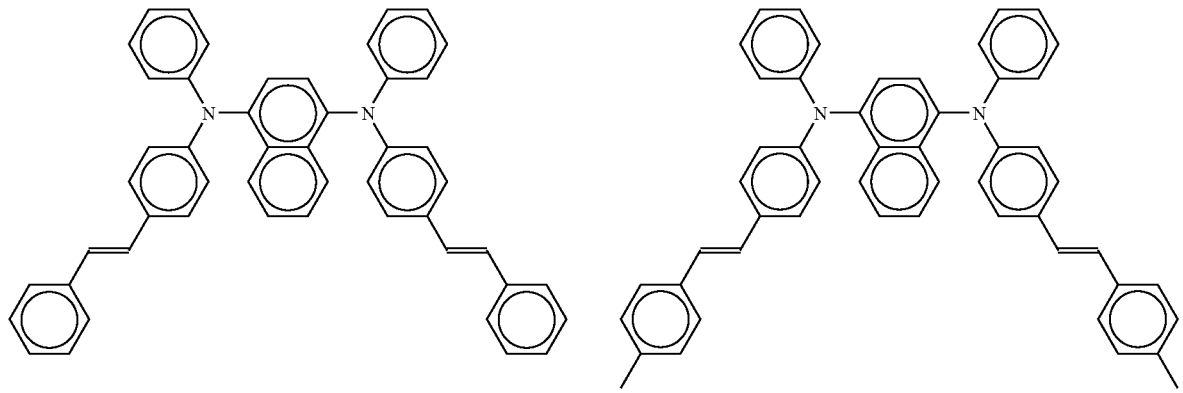
[11]
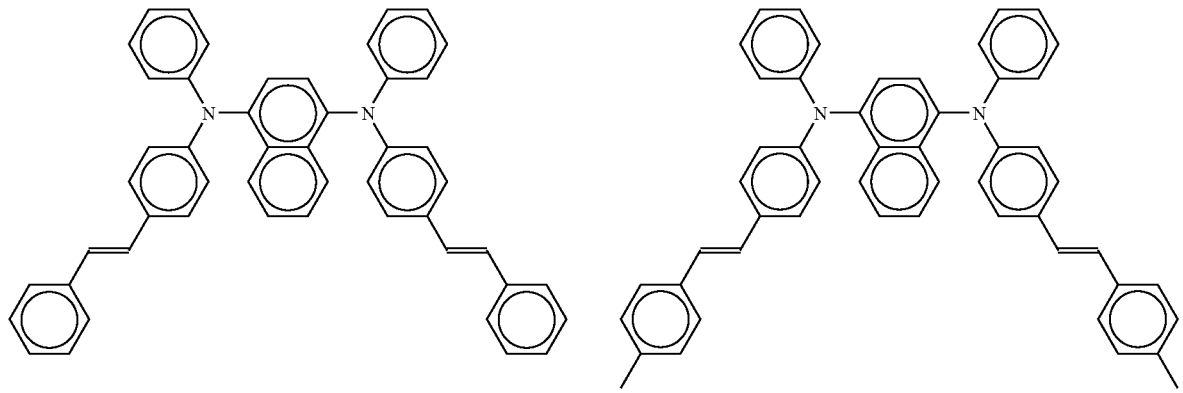
[12]
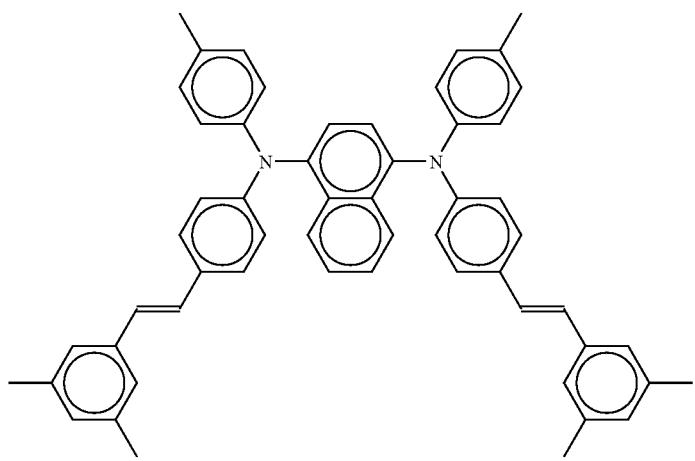
[13]
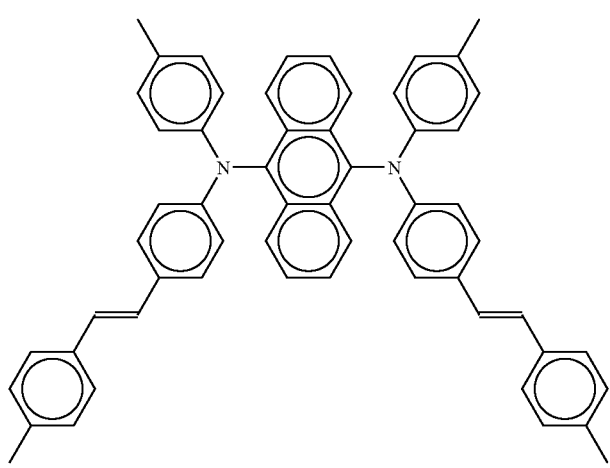
[14]

[15]
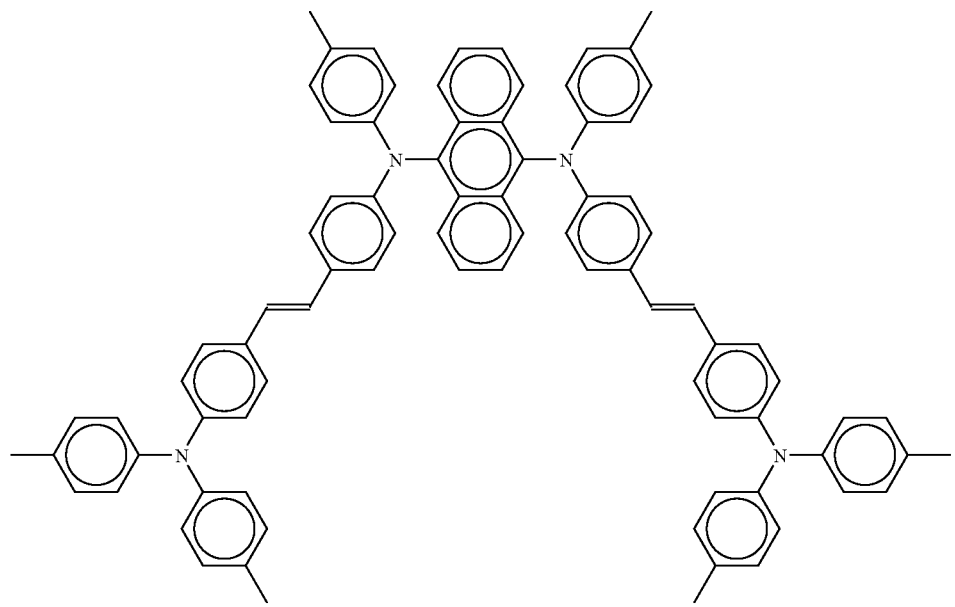
[16]
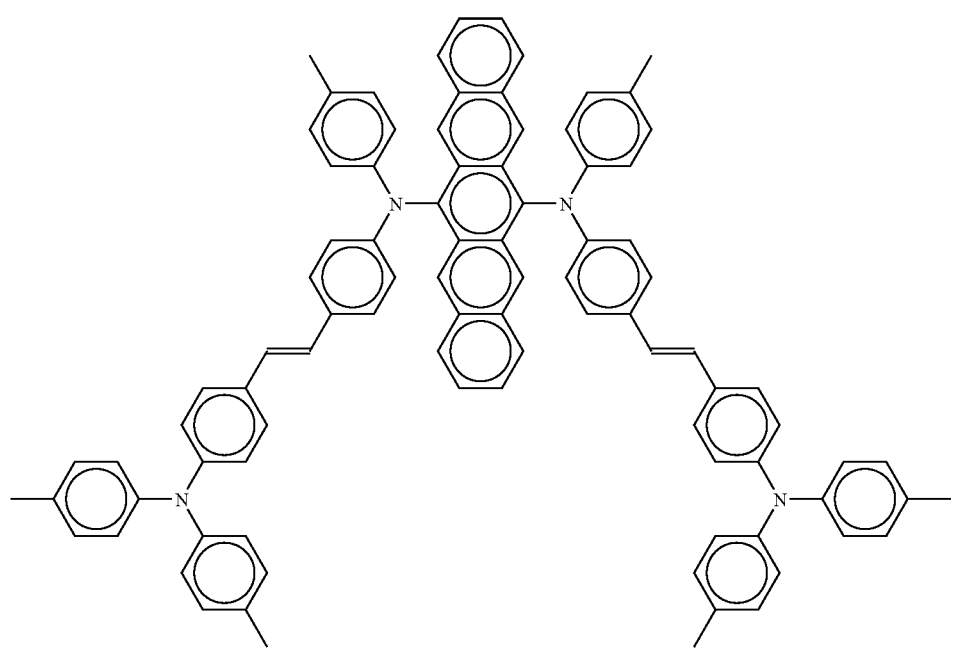

-continued
[17]
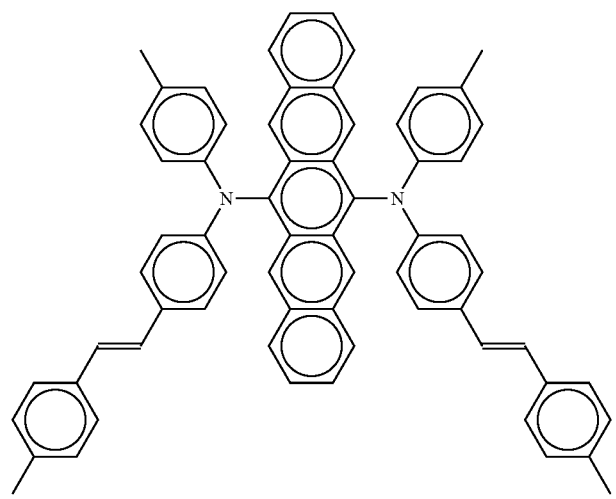
[18]
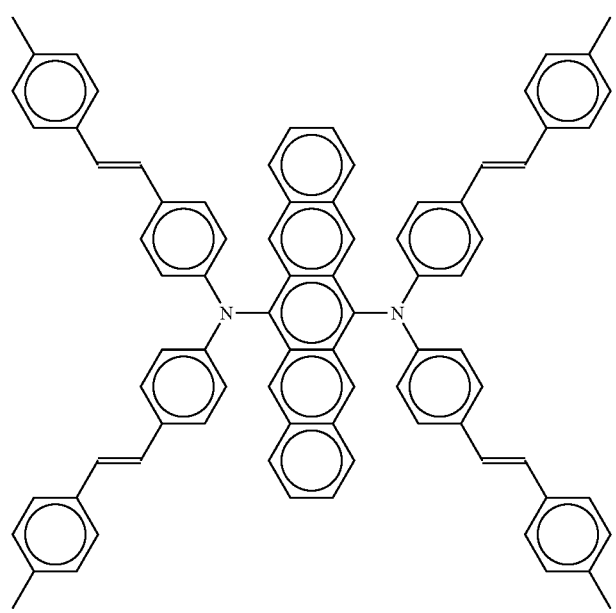

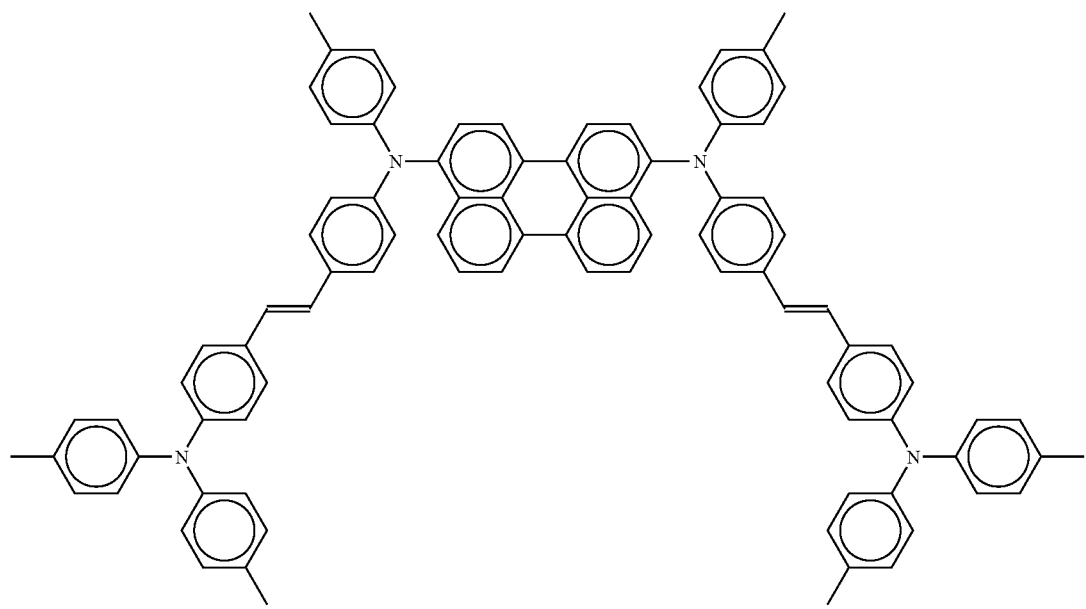
[19]
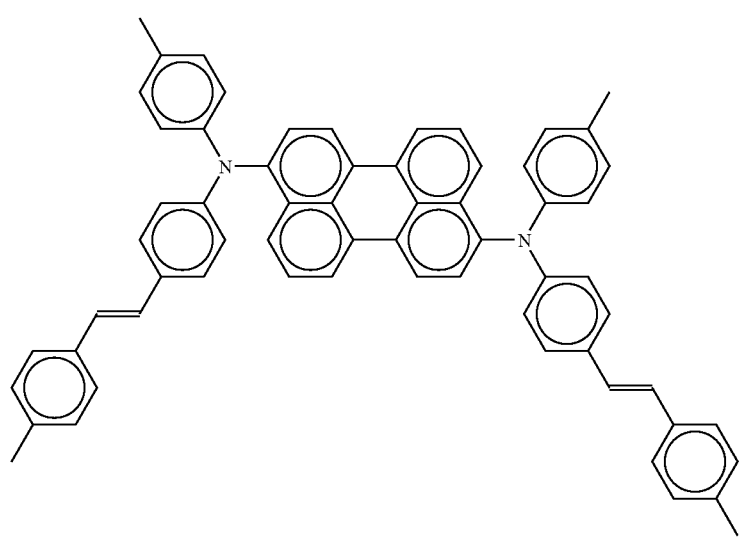
[20]

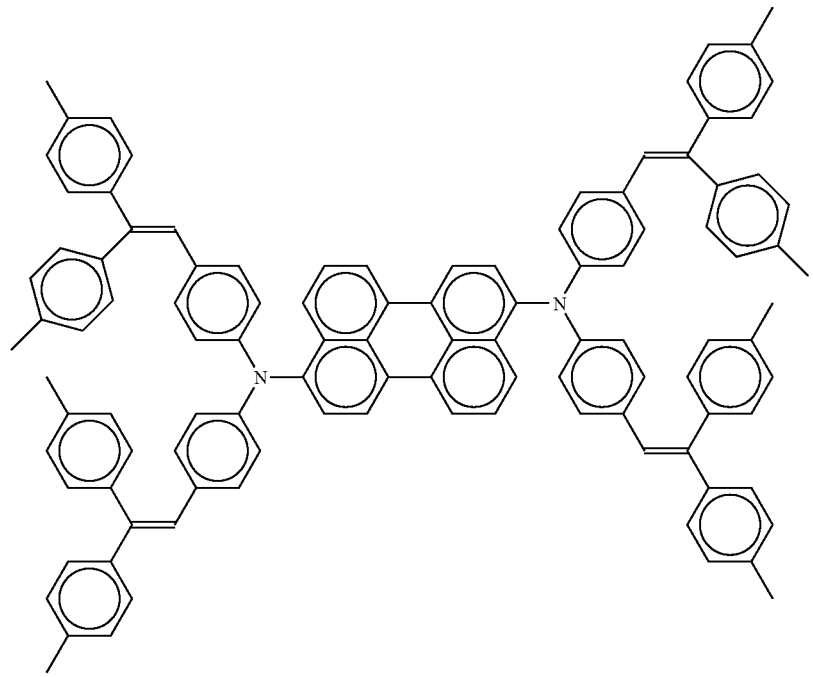
[21]
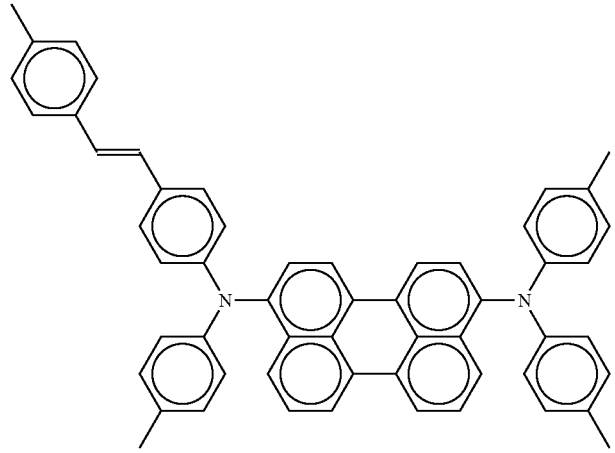
[22]
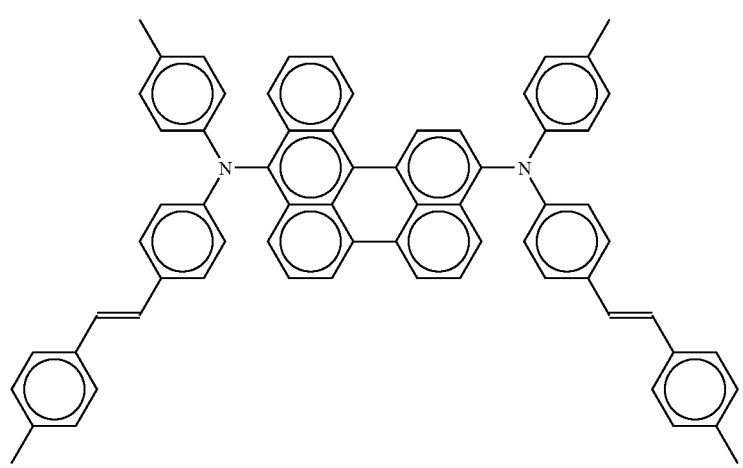
[23]

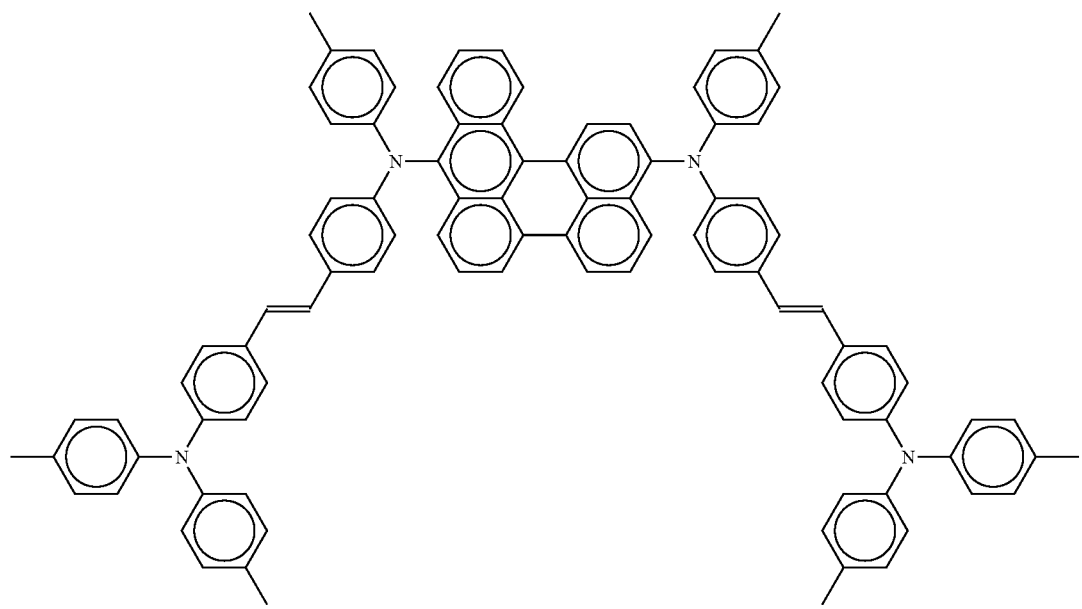
[24]
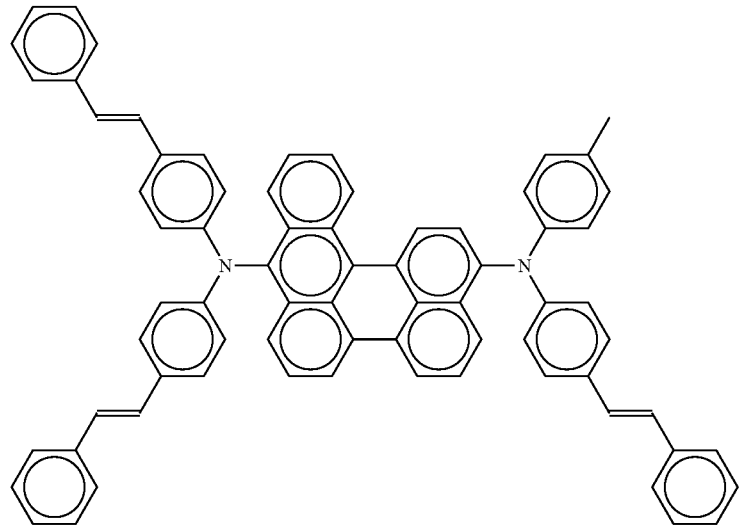
[25]
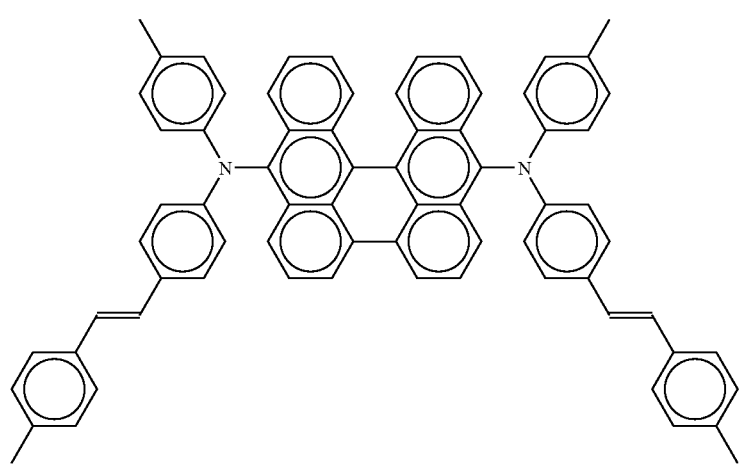
[26]

[27]
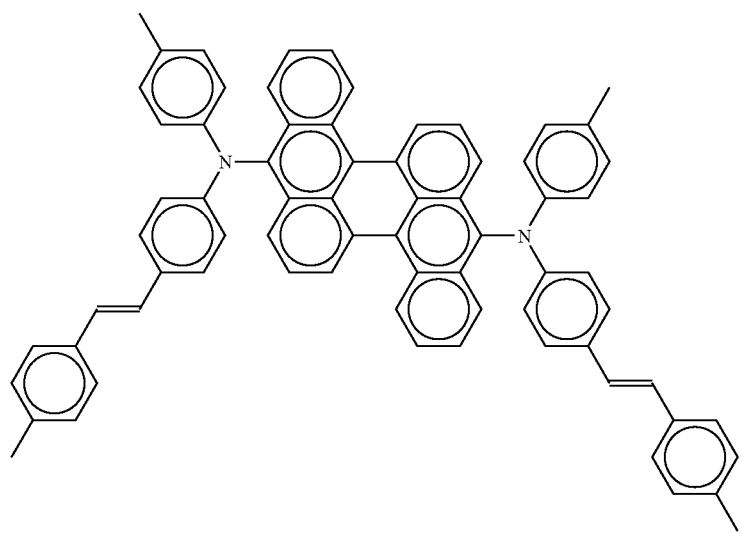
[28]
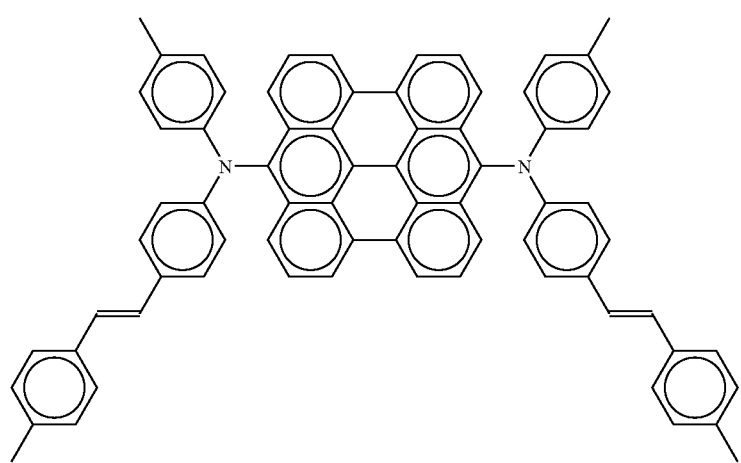
[29]
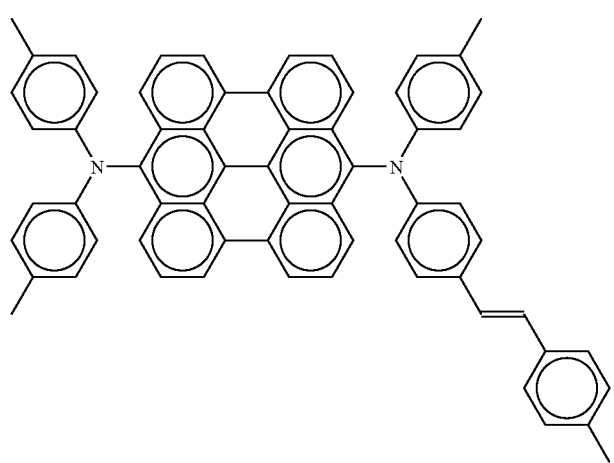

-continued
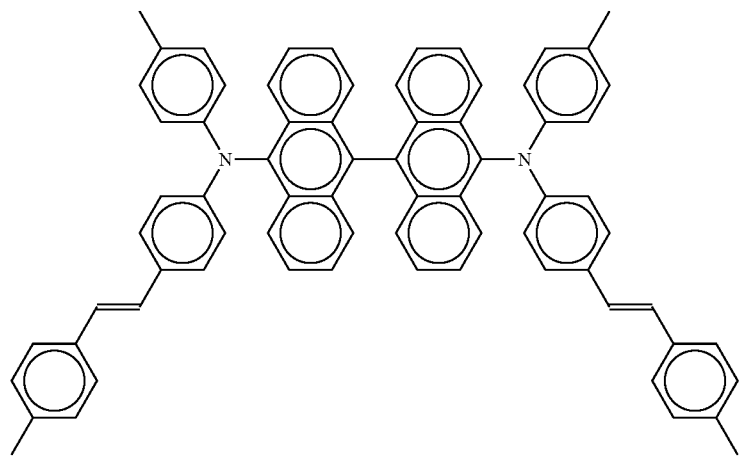
[30]
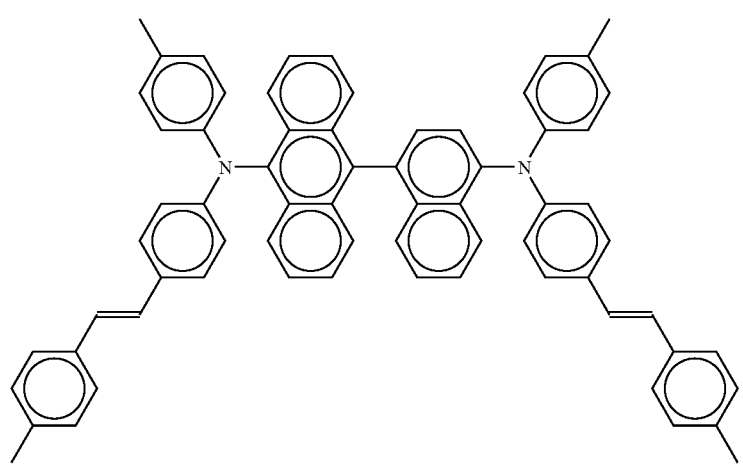
[31]
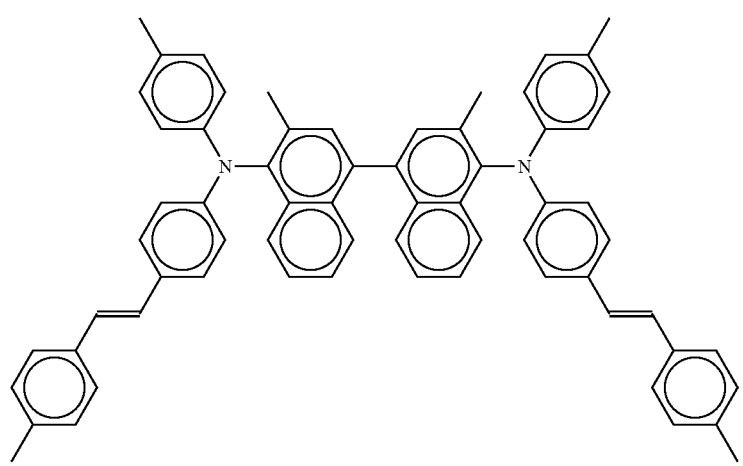
[32]

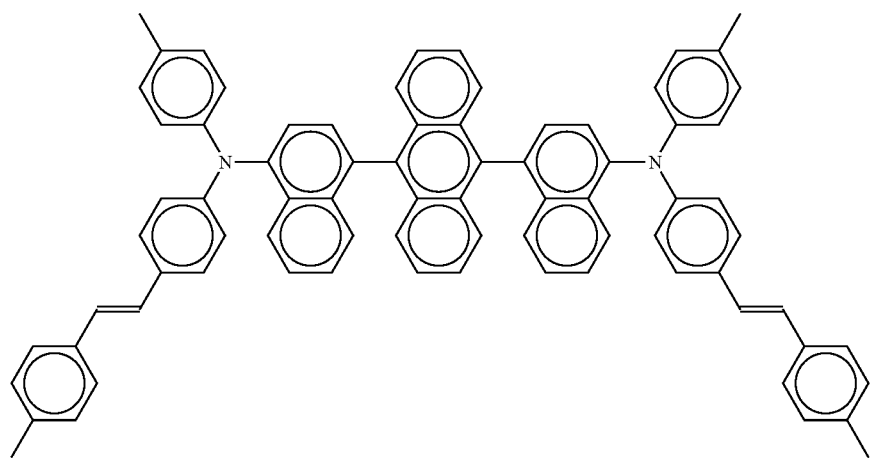
[33]
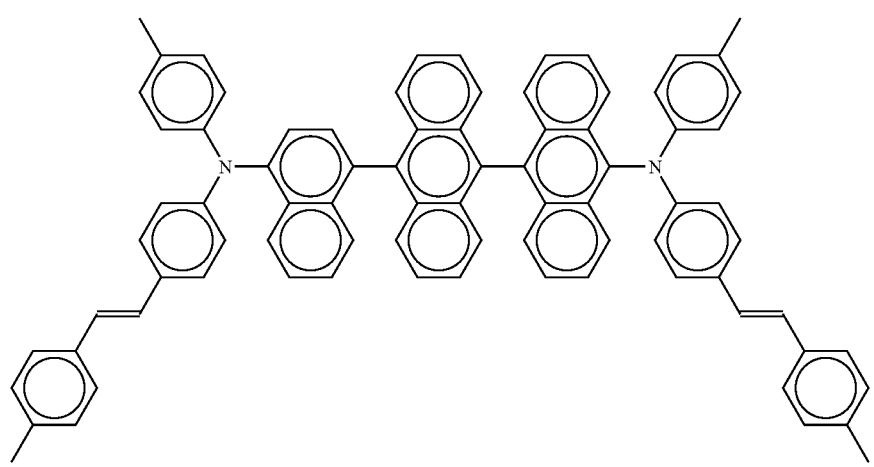
[34]
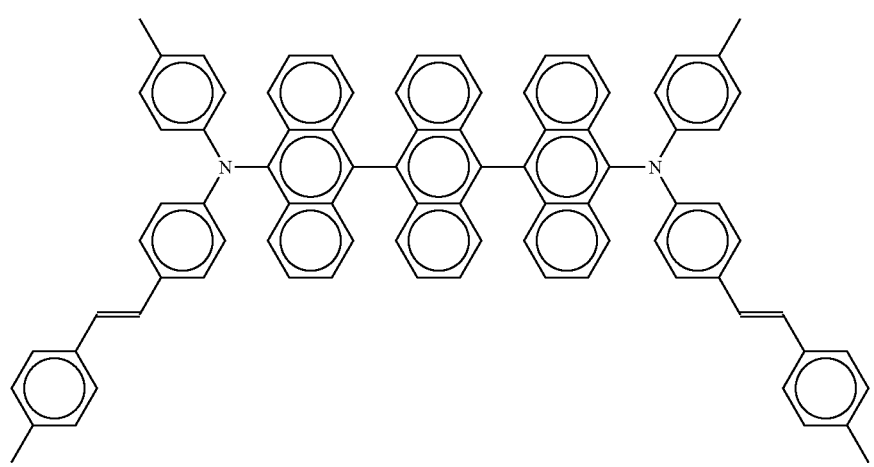
[35]

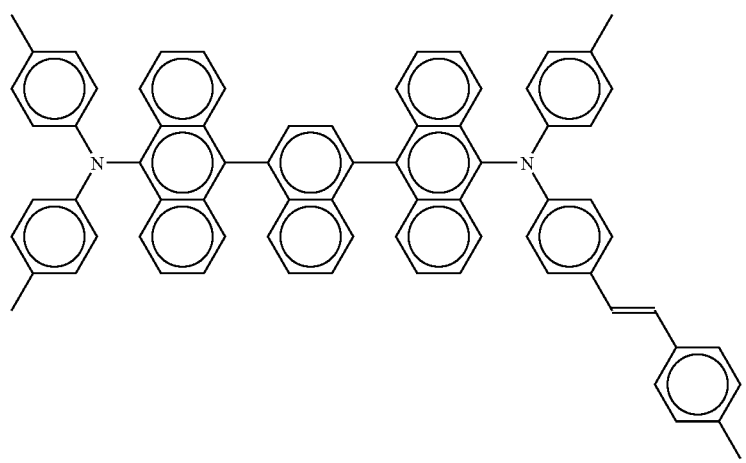
[36]
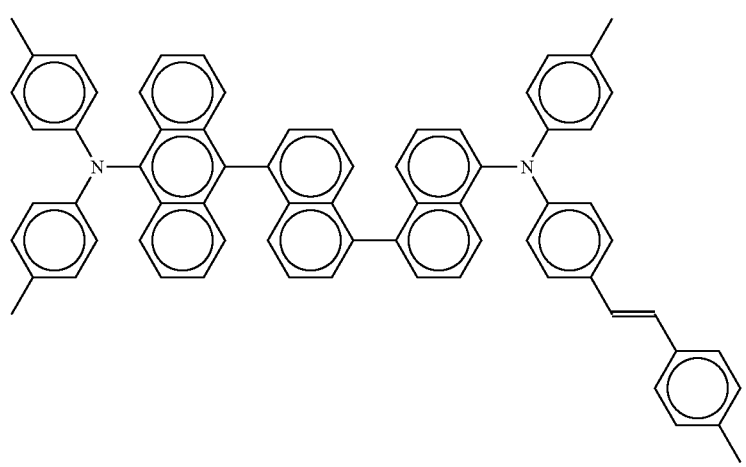
[37]
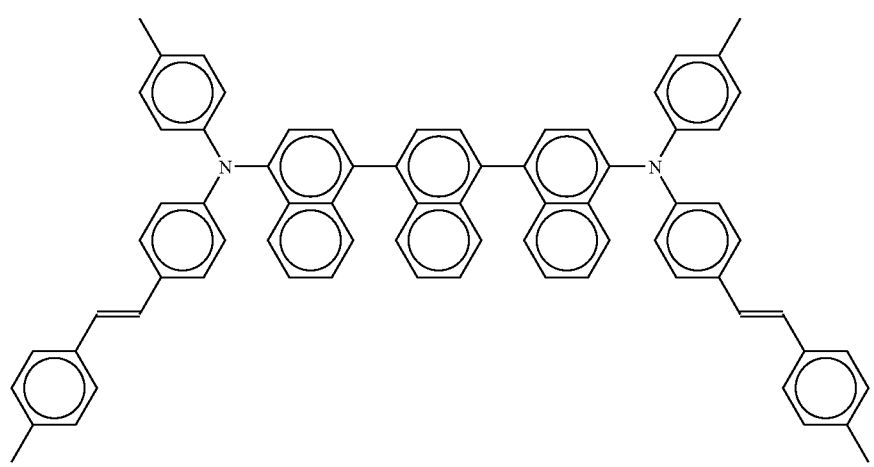
[38]

-continued

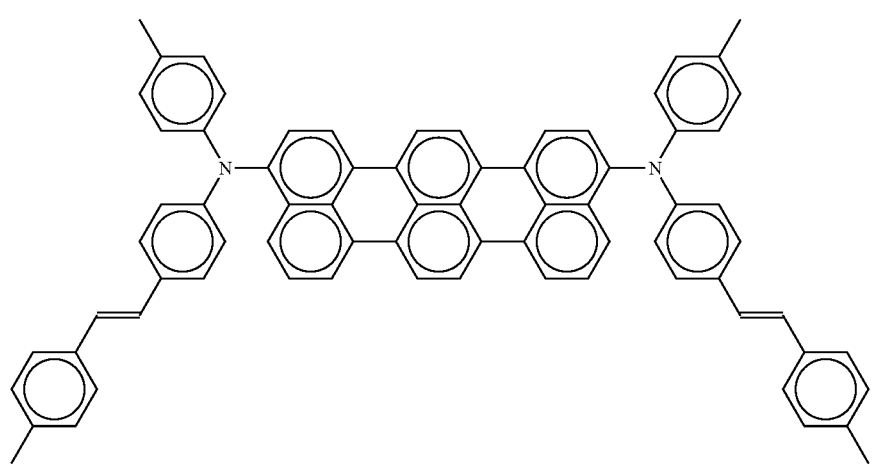

Following are examples of the compounds which can also be used as a electroluminescent material. But the present invention is not limited to these examples unless the spirit or scope of the invention is changed.

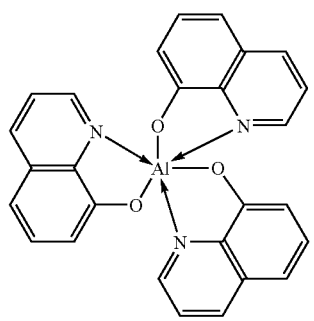

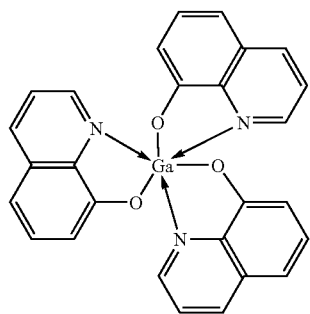

-continued

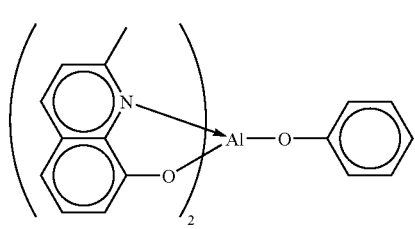

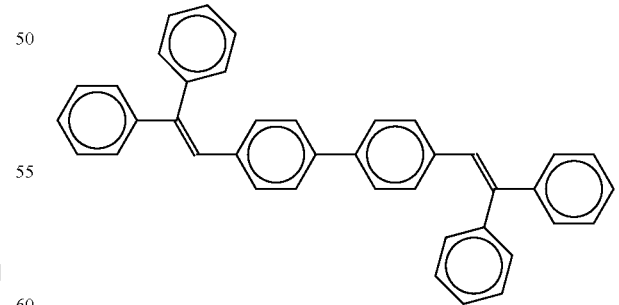

Figure 2:
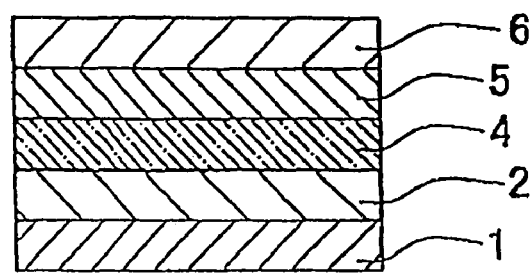
FIG. 2 is a cross-sectional view showing another example of the organic EL device regarding the present invention.
Figure 3:
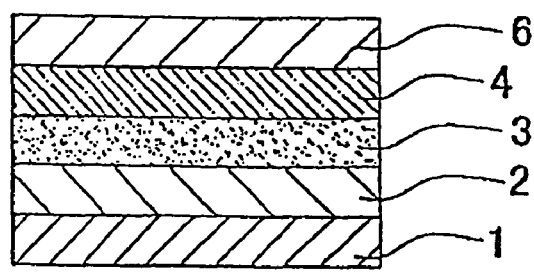
FIG. 3 is a cross-sectional view showing still another example of the organic EL device regarding the present invention.
Figure 4:
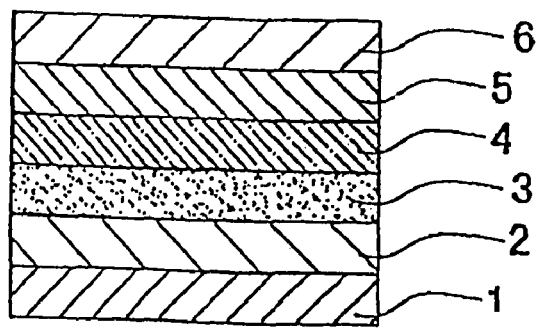
FIG. 4 is a cross-sectional view showing a further example of the organic EL device regarding the present invention.

The organic EL device according to the present invention has a structure in which one organic layer or two or more organic layers are interposed between electrodes, and the present invention includes a structure comprising an anode/ light-emitting zone/cathode as shown in FIG. 1, a structure comprising an anode/light-emitting zone/electron-injecting zone/cathode as shown in FIG. 2, a structure comprising an anode/hole-injecting zone/light-emitting zone/cathode as shown in FIG. 3, and a structure comprising an anode/hole-injecting zone/light-emitting zone/electron-injecting zone/cathode as shown in FIG. 4.

The above-mentioned compounds are used in the organic layer constituting the light-emitting zone, and they are mixed with another hole-injecting material, electroluminescent material, fluorescence material, electron-transporting material and the like to form the light-emitting zone.

Following are examples of the compounds which can be used as a fluorescence material. But the present invention is not limited to these examples unless the spirit or scope of the invention is changed.

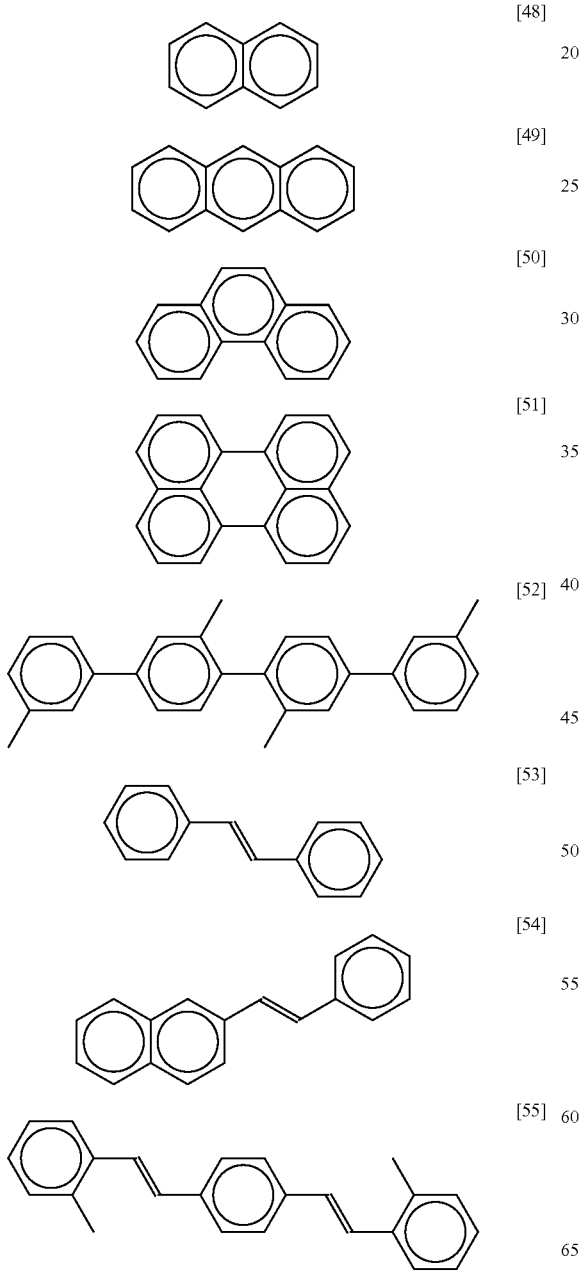
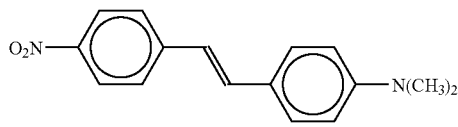
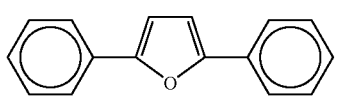
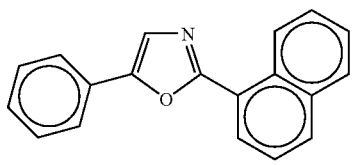
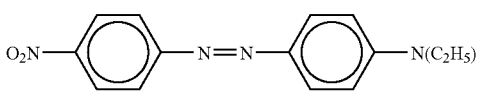
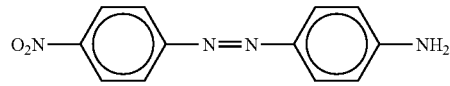
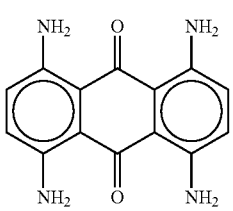
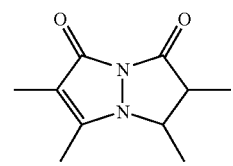
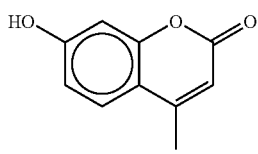
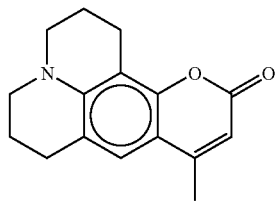
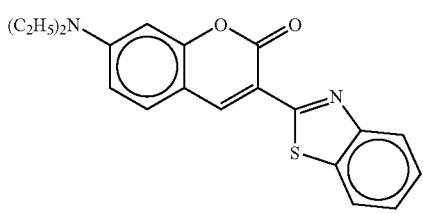

[66]
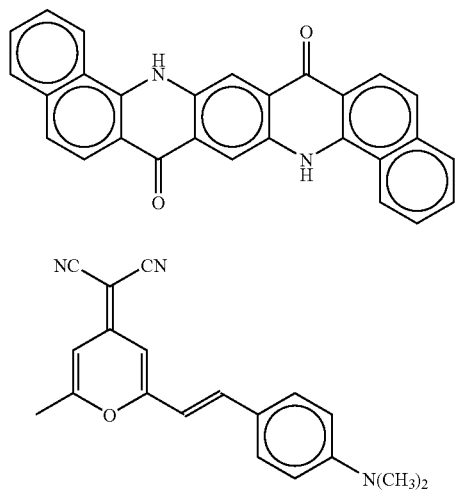

[67]
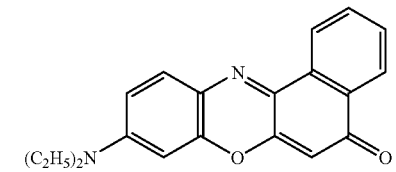

[68]
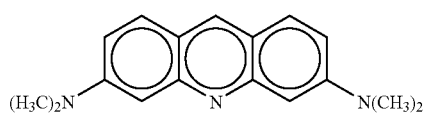

[69]
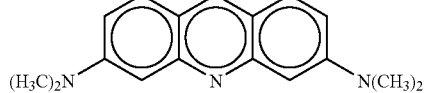

[70]
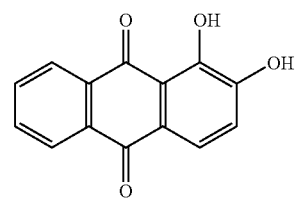

[71]
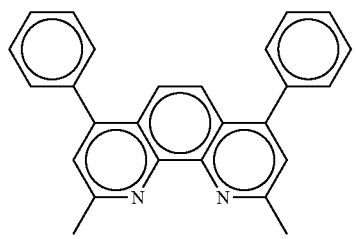

[72]
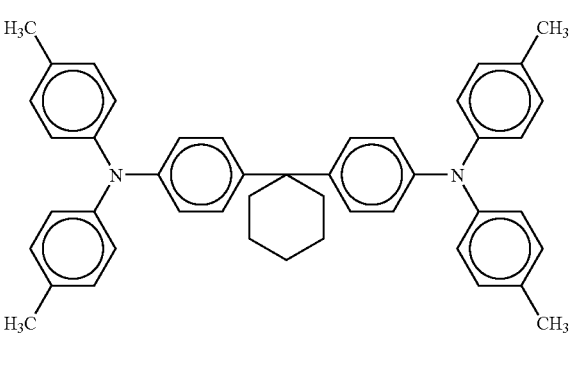

[73]
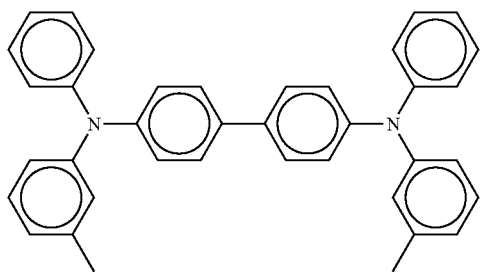

[74]
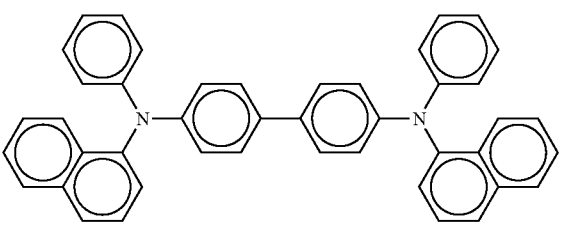

The fluorescent peak positions of the electroluminescent materials and fluorescence materials are determined as the peak top wavelength of the fluorescence spectrum in powder form.

There is no particular limitation imposed on the hole-injecting material to be used in the present invention. Any compound ordinarily employed as a hole-injecting material may be used. Examples include triphenyldiamines such as bis(di(p-tolyl)aminophenyl)-1,1-cyclohexane [72], N,N'-diphenyl-N,N'-bis(3-methylphenyl)-1,1'-biphenyl-4,4'-diamine [73] and N,N'-diphenyl-N-N-bis(1-naphthyl)-1,1'-biphenyl)-4,4'-diamine [74] and starburst type molecules ([75] to [77]).

[75]
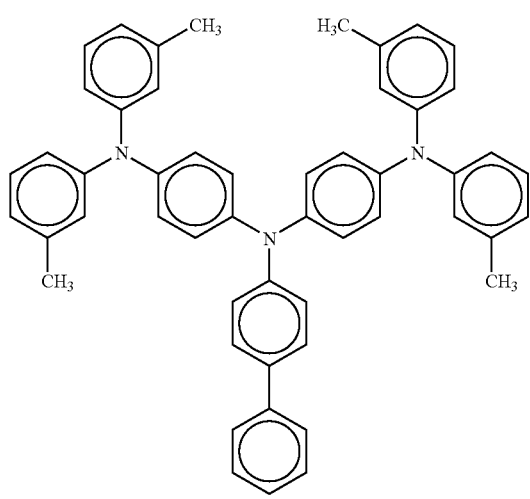

[76]
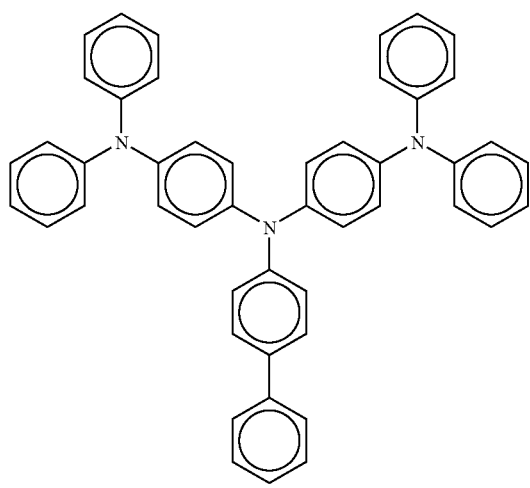

[77]
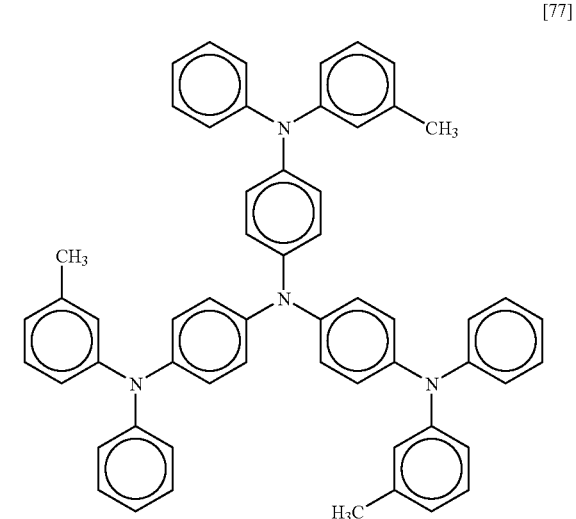

There is no particular limitation imposed on the electron-transporting material to be used in the present invention. Any compound ordinarily employed as a electron-transporting material may be used. Examples include oxadiazole derivatives such as 2-(4-biphenylyl)-5-(4-t-butylphenyl)-1,3,4-oxadiazole [78] and bis{2-(4-t-butylphenyl)-1,3,4-oxadiazole}-m-phenylene [79] and triazole derivatives ([80], [81] and the like).

[78]
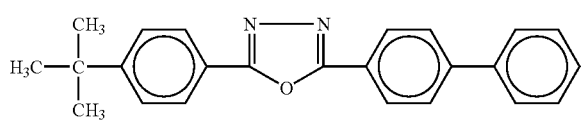

[79]
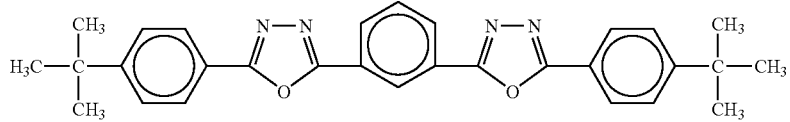

[80]
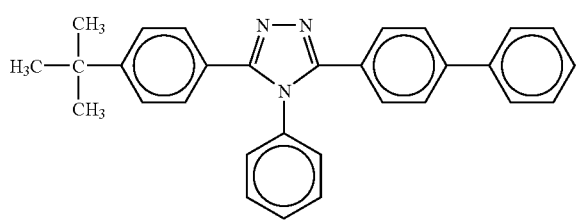

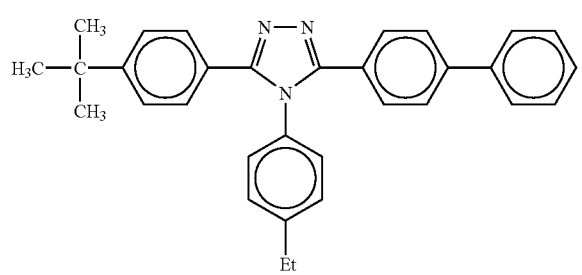

Furthermore, quinolinol-based metal complexes as represented by formulae [82], [83] and [84] are also used as the electron-transporting material, wherein Q designates a substituted or non-substituted hydroxyl quinoline derivative or a substituted or non-substituted benzoquinoline derivative, "M" designates a metal atom, "n" designates a valency thereof, "L" designates a halogen atom, a substituted or non-substituted alkyl group, a substituted or non-substituted cycloalkyl group, and a substituted or non-substituted aryl group which may includes nitrogen atom.

$(Q)_n$-M [82]

wherein Q is a substituted or an unsubstituted hydroxyquinoline derivative, or a substituted or an unsubstituted benzoquinoline derivative; M is a metal atom; and n is its valence.

$(Q)_{n-1}$-M-O-L [83]

wherein Q is a substituted or an unsubstituted hydroxyquinoline derivative, or a substituted or an unsubstituted benzoquinoline derivative; L is a halogen atom, a substituted or an unsubstituted alkyl group, a substituted or an unsubstituted cycloalkyl group, a substituted or an unsubstituted aryl group which may contain a nitrogen atom;

M is a metal atom; and n is its valence.

$(Q)_{n-1}$-M-O-M-$(Q)_{n-1}$ [84]

Typical examples of the compound represented by formula [82] include the following compounds represented by [85] to [90].

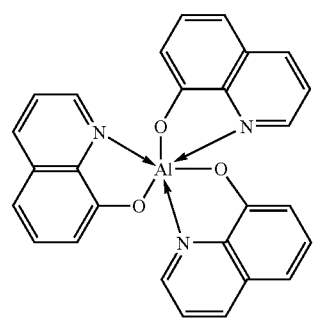

[85]

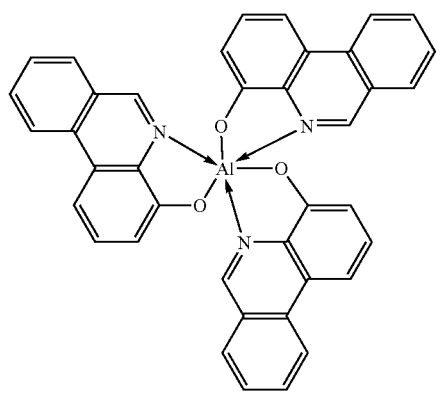

[86]

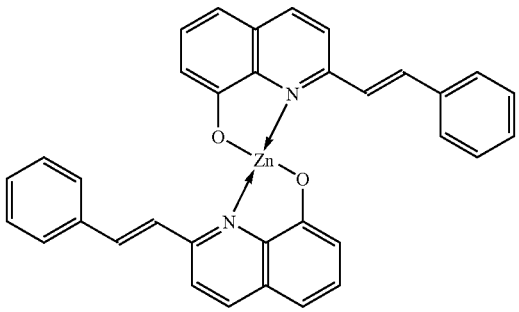

[87]

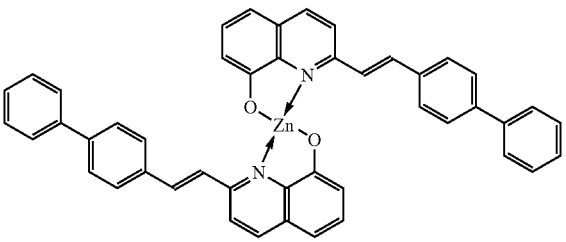

[88]

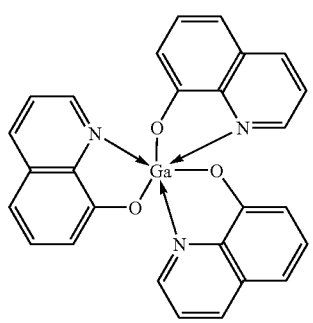

[89]

[90]

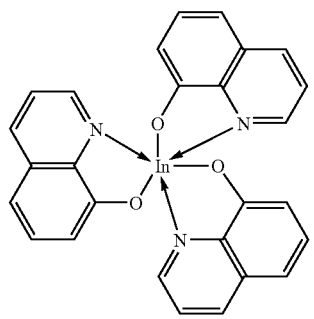

Similarly, typical examples of the compound represented by formula [83] include the following compounds represented by [91] to [96].

[91]

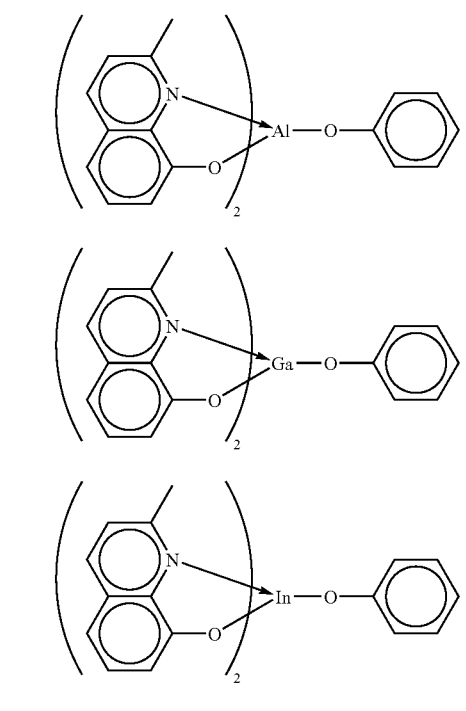

[92]

[93]

[94]

[95]

[96]

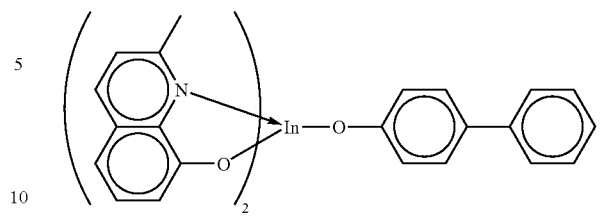

Furthermore, typical examples of the compound represented by formula [84] include the following compounds represented by [97] to [99].

[97]

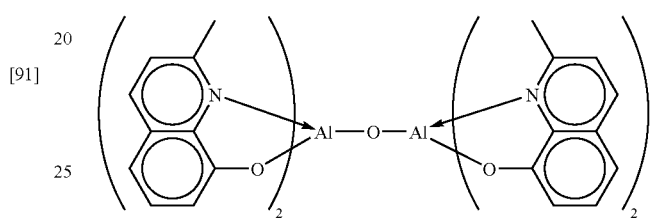

[98]

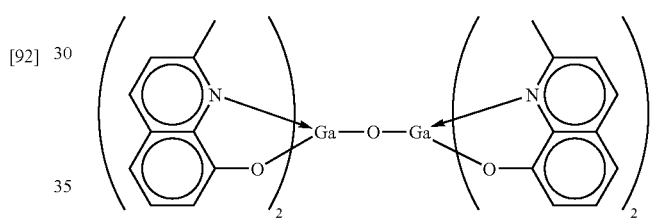

[99]

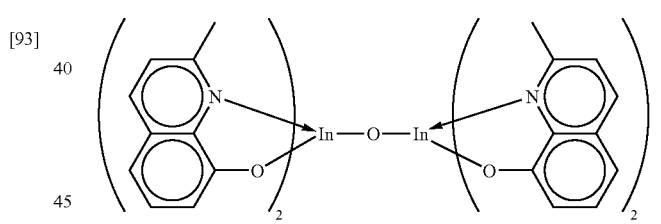

A light-emitting zone which is doped with metal having a smaller work function to make the zone electron-injectable can be used. Although there is no particular limitation imposed on the doping metal, specific examples include lithium, magnesium and aluminum which may constitute the cathode is preferably employed.

The anode of the organic EL device plays the role of injecting holes into the light-emitting zone or the hole-injecting zone, and it is effective that the anode has a work function of 4.5 eV or more. Typical applicable examples of an anode material which can be used in the present invention include indium tin oxide alloy (ITO), tin oxide (NESA), gold, silver, platinum and copper.

As a pretreatment method of the anode, there can be used a suitable combination of a wet cleaning method, ozone cleaning, an exposure of plasma such as oxygen, ultraviolet light irradiation by an excimer UV lamp, an excimer laser or a deuterium lamp, or the like.

Furthermore, the cathode is preferably made of a material having a small work function for the purpose of injecting the electrons into the electron-injecting zone or the light-emitting zone. Although there is no particular limitation imposed on the cathode material, but typical usable examples of the cathode material include indium, aluminum, magnesium, magnesium-indium alloy, magnesium-aluminum alloy, aluminum-lithium alloy, aluminum-scandium-lithium alloy and magnesium-silver alloy.

Each layer of the organic EL device according to the present invention can be fabricated by any method. Conventionally known methods such as vacuum deposition and spin coating can be employed. The organic thin-film layer which is to be used in the organic EL device of the present invention and contains the compounds of the general formula [1] above can be fabricated by a known method such as vacuum deposition, molecular beam epitaxy (MBE) or coating including dipping, spin coating, casting, bar coating or roll coating of a solution of the compounds dissolved in a proper solvent. Especially, the vacuum evaporation method is preferable.

There is no particular limitation on the thickness of each organic layer of the organic EL device of the present invention. When the thickness of layer is too thin, defects such as spin holes tend to occur. When the thickness of layer is too thick, on the other hand, a high-applied voltage is required, which decreases the efficiency. Usually, the organic layers are therefore preferred to have a thickness within a range of several nm to 1 µm.

The present invention will hereinafter be described in detail by examples. It should however be borne in mind that the present invention is not limited only to the following examples so long as they do not depart from the spirit or scope of the invention.

EXAMPLE 1

FIG. 1 shows a cross-sectional structure of an organic EL device regarding Example 1. The organic EL device regarding this example comprises a glass substrate 1, an anode 2 and a cathode 6 formed on the glass substrate 1, and a light-emitting zone 4 sandwiched between the anode 2 and the cathode 6.

Hereinafter, a preparation procedure of the organic EL device regarding Example 1 will be described.

First, ITO was sputtered on a glass substrate to form a film having a sheet resistance of 20 Ω/□ as an anode. The ITO-covered substrate was washed with an alkali cleaning fluid, and then with isopropyl alcohol. The cleaned substrate was irradiated with an ultraviolet light of wavelength 172 nm by Xe2* lamp for three minutes. Over the anode, a 60 nm thick light-emitting zone was formed by the vacuum deposition of the compound represented by formula [3] whose fluorescent peak position is 470 nm and the compound represented by formula [20] whose fluorescent peak position is 580 nm. Then, a 150 nm thick cathode was formed by the vacuum deposition of magnesium-silver alloy, whereby the organic EL device was fabricated.

When a DC voltage of 10 V was applied to the thus obtained organic EL device, the emission spectrum includes a peak at 640 nm and a shoulder at about 680 nm, and a reddish-orange light emission of 3100 cd/m2 was obtained.

EXAMPLE 2

The same procedure as in Example 1 was conducted except that a light-emitting zone 4 was formed as thick as 60 nm by a spin coating method using a chloroform solution in which the equal amounts of compounds [3] and [20] were dissolved, thereby preparing an organic EL device.

When a DC voltage of 10 V was applied to the thus obtained organic EL device, the emission spectrum includes a peak at 637 nm and a shoulder at about 680 nm, and a reddish-orange light emission of 2200 cd/m2 was obtained.

EXAMPLE 3

FIG. 2 shows a cross-sectional structure of an organic EL device regarding Example 3. The organic EL device regarding this example comprises a glass substrate 1, an anode 2 and a cathode 6 formed on the glass substrate 1, and a light-emitting zone 4 and an electron-injecting zone 5 sandwiched between the anode 2 and the cathode 6.

Hereinafter, a preparation procedure of the organic EL device regarding Example 3 will be described.

First, ITO was sputtered on a glass substrate to form a film having a sheet resistance of 20 Ω/□ as an anode. The ITO-covered substrate was washed with an alkali cleaning fluid, and then with isopropyl alcohol. The cleaned substrate was irradiated with an ultraviolet light of wavelength 172 nm by Xe2* lamp for three minutes. Over the anode, a 60 nm thick light-emitting zone was formed by the vacuum deposition of the compound represented by formula [3] whose fluorescent peak position is 470 nm and the compound represented by formula [20] whose fluorescent peak position is 580 nm. Then, a 25 nm thick electron-injecting zone was formed by the vacuum deposition of compound represented by formula [91]. Then, a 150 nm thick cathode was formed by the vacuum deposition of magnesium-silver alloy, whereby the organic EL device was fabricated.

Figure 5:
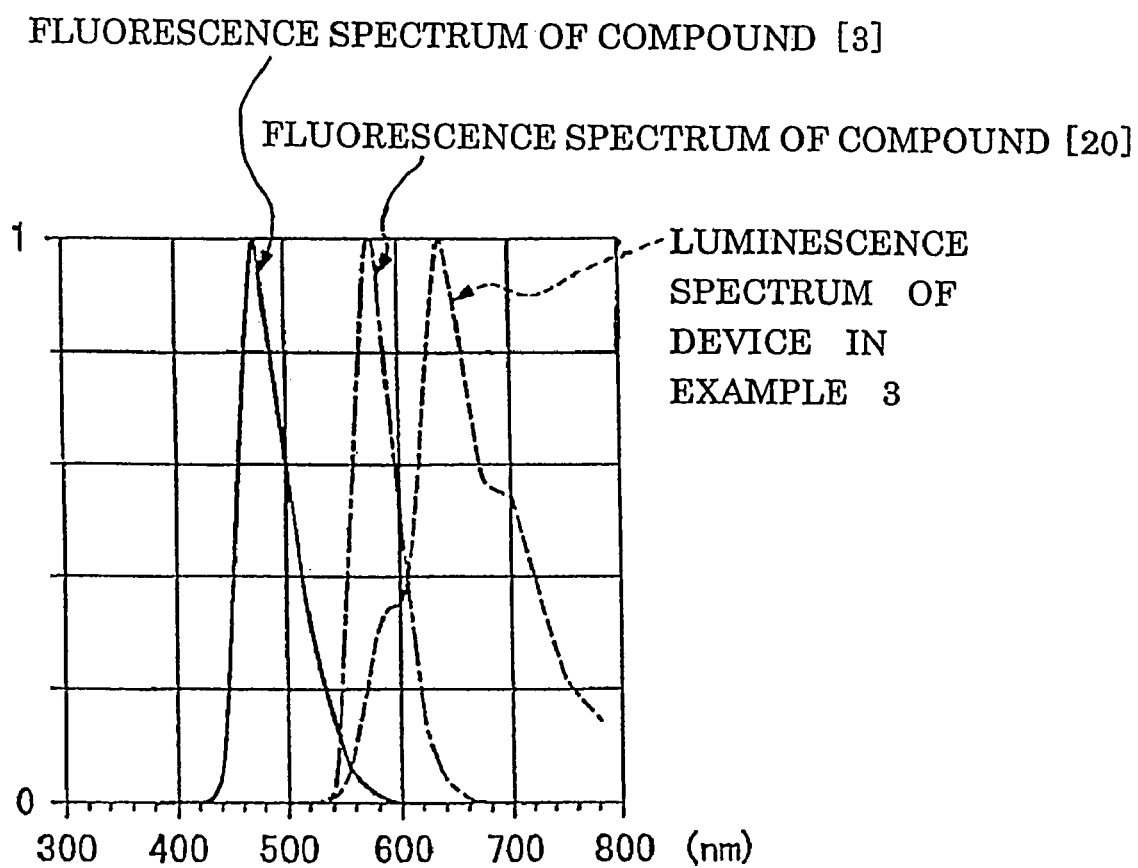
FIG. 5 shows an emission spectrum of the organic EL device regarding the present invention and a fluorescence spectrum of a compound used in a light-emitting zone.

FIG. 5 shows an EL spectra at a time when a DC voltage of 10 V was applied to the thus obtained organic EL device, and a fluorescence spectrum of the above compounds represented by formula [3] and [20]. The emission spectrum includes a peak at 641 nm and a shoulder at about 680 nm. And these wavelength are different from both the fluorescent peak position of the compounds represented by formula [3] and [20], and a reddish-orange light emission of 5200 cd/m2 was obtained.

EXAMPLE 4

The same procedure as in Example 3 was conducted except that a compound [20] whose fluorescent peak position is 580 nm and a compound [44] whose fluorescent peak position is 368 nm were used to form a light-emitting zone 4, thereby preparing an organic EL device.

When a DC voltage of 10 V was applied to the thus obtained organic EL device, the emission spectrum includes a peak at 620 nm, and a reddish-orange light emission of 5900 cd/m2 was obtained.

EXAMPLE 5

The same procedure as in Example 3 was conducted except that a compound [8] whose fluorescent peak position is 470 nm and a compound [51] whose fluorescent peak position is 500 nm were used to form a light-emitting zone 4, thereby preparing an organic EL device.

When a DC voltage of 10 V was applied to the thus obtained organic EL device, the emission spectrum includes a peak at 520 nm and shoulders at about 560 nm and 600 nm, and a yellowish-orange light emission of 13800 cd/m2 was obtained.

EXAMPLE 6

The same procedure as in Example 3 was conducted except that a compound [3] whose fluorescent peak position is 470 nm and a compound [51] whose fluorescent peak position is 500 nm were used to form a light-emitting zone 4, thereby preparing an organic EL device.

When a DC voltage of 10 V was applied to the thus obtained organic EL device, the emission spectrum includes a peak at 520 nm and shoulders at about 550 nm and 600 nm, and a yellowish-orange light emission of 11500 cd/m2 was obtained.

EXAMPLE 7

FIG. 4 shows a cross-sectional structure of an organic EL device regarding Example 7. The organic EL device regarding this example comprises a glass substrate 1, an anode 2 and a cathode 6 formed on the glass substrate 1, and a hole-injecting zone 3, a light-emitting zone 4 and an electron-injecting zone 5 sandwiched between the anode 2 and the cathode 6.

Hereinafter, a preparation procedure of the organic EL device regarding Example 7 will be described.

First, ITO was sputtered on a glass substrate to form a film having a sheet resistance of 20 Ω/□ as an anode. The ITO-covered substrate was washed with an alkali cleaning fluid, and then with isopropyl alcohol. The cleaned substrate was irradiated with an ultraviolet light of wavelength 172 nm by Xe2* lamp for three minutes. Over the anode, a 25 nm thick hole-injecting zone was formed by the vacuum deposition of compound represented by formula [76]. Then, a 60 nm thick light-emitting zone was formed by the vacuum deposition of the compound represented by formula [3] whose fluorescent peak position is 470 nm and the compound represented by formula [20] whose fluorescent peak position is 580 nm. Then, a 25 nm thick electron-injecting zone was formed by the vacuum deposition of compound represented by formula [91]. Then, a 150 nm thick cathode was formed by the vacuum deposition of magnesium-silver alloy, whereby the organic EL device was fabricated.

When a DC voltage of 10 V was applied to the thus obtained organic EL device, the emission spectrum includes a peak at 638 nm and a shoulder at about 680 nm, and a reddish-orange light emission of 3900 cd/m2 was obtained.

What is claimed is:

1. An organic electroluminescent device, comprising
a light-emitting material,
wherein the light-emitting material comprises two compounds, and a spectrum of luminescence from the light-emitting material includes at least one peak that does not correspond to any peak present in a spectrum of luminescence of either individual compound,
wherein the two compounds each comprise at least one electroluminescent material represented by the following formula

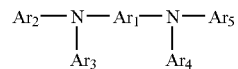

wherein $Ar_1$ designates a divalent group represented by the formula,

wherein $Ar_6$ to $Ar_8$ are each imidazole, pyrazole, isothiazole, isoxazole, pyrimidine, pyridazine, furazane, thianthrene, isobenzofuran, indolizine, isoindole, 1H-indazole, purine, phthalazine, naphthyridine, quinazoline, cinnoline, pteridine, β-carbazoline, phenanthridine, acridine, perimidine, or phenoxazine, wherein $Ar_2$ to $Ar_5$ designate, independently with one another, a substituted or non-substituted aryl group having 6 to 20 carbon atoms, and wherein at least one of $Ar_2$ to $Ar_5$ of the compound represented by the formula has a substituted or non-substituted styryl group as a substituent.

\* \* \* \* \*